United States Patent
Abe

(10) Patent No.: US 8,245,103 B2
(45) Date of Patent: Aug. 14, 2012

(54) ARITHMETIC CIRCUIT FOR CONCATENATED CODES AND ADDRESS CONTROL METHOD

(75) Inventor: Nobuo Abe, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 535 days.

(21) Appl. No.: 12/491,575

(22) Filed: Jun. 25, 2009

(65) Prior Publication Data

US 2010/0070833 A1    Mar. 18, 2010

(30) Foreign Application Priority Data

Sep. 16, 2008 (JP) ................................ 2008-235964

(51) Int. Cl.
*H03M 13/00* (2006.01)
(52) U.S. Cl. ..................... 714/755; 714/758; 714/762
(58) Field of Classification Search .................. 714/755, 714/758, 762; 712/241, 233
See application file for complete search history.

(56) References Cited

U.S. PATENT DOCUMENTS

| 5,185,711 | A  | * | 2/1993  | Hattori         | 708/492 |
| 7,072,320 | B2 | * | 7/2006  | Filho           | 370/335 |
| 8,055,886 | B2 | * | 11/2011 | Tashiro et al.  | 712/241 |

OTHER PUBLICATIONS

ITU-T Rec. G.709/Y.1331 (Mar. 2003), pp. 24-25.
ITU-T Rec. G.975.1 (Feb. 2004)—Prepublished version, pp. 15-20.

* cited by examiner

*Primary Examiner* — Fritz Alphonse
(74) *Attorney, Agent, or Firm* — McDermott Will & Emery LLP

(57) ABSTRACT

Concatenated codes are improved, and a memory capacity and a memory diagnosis circuit are reduced. Address control used in an interleaver of related art is applied to a register included in a syndrome arithmetic circuit or a check code calculation circuit of related art, and an arithmetic operation result equivalent to that obtained by interleaving is derived.

16 Claims, 25 Drawing Sheets

STRUCTURE OF CODING CIRCUIT AND DECODING CIRCUIT

RELATION BETWEEN EACH FRAME, EACH SEGMENT AND ADDRESS

| SEGMENT / FRAME NUMBER | #000 | #001 | #002 | #003 | #004 | #005 | #006 | #007 | #008 | #009 | #010 | .. | #238 | #239 | #240 | #241 | .. | #254 |
|---|---|---|---|---|---|---|---|---|---|---|---|---|---|---|---|---|---|---|
| #-7 FRAME | 0 | | | | | | | | 0 | | | .. | | | 0 | | | |
| #-6 FRAME | 1 | 0 | | | | | | | 1 | 0 | | .. | | | 1 | 0 | | |
| #-5 FRAME | 2 | 1 | 0 | | | | | | 2 | 1 | 0 | .. | | | 2 | 1 | | |
| #-4 FRAME | 3 | 2 | 1 | 0 | | | | | 3 | 2 | 1 | .. | | | 3 | 2 | | |
| #-3 FRAME | 4 | 3 | 2 | 1 | 0 | | | | 4 | 3 | 2 | .. | | | 4 | 3 | | |
| #-2 FRAME | 5 | 4 | 3 | 2 | 1 | 0 | | | 5 | 4 | 3 | .. | | | 5 | 4 | | |
| #-1 FRAME | 6 | 5 | 4 | 3 | 2 | 1 | 0 | | 6 | 5 | 4 | .. | 0 | | 6 | 5 | | |
| #0 FRAME | 7 | 6 | 5 | 4 | 3 | 2 | 1 | 0 | 7 | 6 | 5 | .. | 1 | 0 | 7 | 6 | | |
| #1 FRAME | 0 | 7 | 6 | 5 | 4 | 3 | 2 | 1 | 0 | 7 | 6 | .. | 2 | 1 | 0 | 7 | | |
| #2 FRAME | 1 | 0 | 7 | 6 | 5 | 4 | 3 | 2 | 1 | 0 | 7 | .. | 3 | 2 | 1 | 0 | | |
| #3 FRAME | 2 | 1 | 0 | 7 | 6 | 5 | 4 | 3 | 2 | 1 | 0 | .. | 4 | 3 | 2 | 1 | | |
| #4 FRAME | 3 | 2 | 1 | 0 | 7 | 6 | 5 | 4 | 3 | 2 | 1 | .. | 5 | 4 | 3 | 2 | | |
| #5 FRAME | 4 | 3 | 2 | 1 | 0 | 7 | 6 | 5 | 4 | 3 | 2 | .. | 6 | 5 | 4 | 3 | | |
| #6 FRAME | 5 | 4 | 3 | 2 | 1 | 0 | 7 | 6 | 5 | 4 | 3 | .. | 7 | 6 | 5 | 4 | | |
| #7 FRAME | 6 | 5 | 4 | 3 | 2 | 1 | 0 | 7 | 6 | 5 | 4 | .. | 0 | 7 | 6 | 5 | | |

HERE, SYNDROME VALUE USING VALUE STORED IN #7 STORAGE ELEMENT IS CALCULATED.

FIG. 6

FLOWCHART OF (ADDRESS CONTROL FOR EACH FRAME) AT FRAME TO!

FLOWCHART OF SYNDROME ARITHMETIC OPERATION
OF IMPROVED 16-BIT I/F VERSION BCH(3860, 3824)

ARITHMETIC CIRCUIT FOR CONCATENATED CODES AND ADDRESS CONTROL METHOD

CLAIM OF PRIORITY

The present application claims priority from Japanese patent application JP 2008-235964 filed on Sep. 16, 2008, the content of which is hereby incorporated by reference into this application.

BACKGROUND OF THE INVENTION

1. Field of the Invention

The present invention relates to an arithmetic circuit for concatenated codes and an address control method, and particularly to an arithmetic circuit for concatenated codes in which an efficient circuit structure is realized and an algorithm of improved concatenated codes is applied, and an address control method.

2. Description of the Related Art

In recent years, telecommunications carriers in all the world are configuring a next generation network (hereinafter referred to as NGN). A transmission network in the NGN has a hierarchical structure as shown in FIG. 1, and in this structure, an optical core metro network of from metro/access network (100 Km or less) to core (exceeding 1000 Km) is configured by an optical transport system.

In the optical transport system, in order to reduce the maintenance of a network administrator and the operation cost, Optical Transport Network (OTN) standards determined in Recommendation G.709 by International Telecommunication Union (Hereinafter referred to as ITU-T) in 2003 are adopted.

In the OTN standards, it is normally determined to add a function to correct an error applied to an information transmission frame by information deterioration on a transmission path, and Recommendation G.975.1 describes eight types of algorithms to realize the error correction function. Most of these are concatenated codes in which Bose-Chaudhuri-Hocquenghem (BCH) codes or Reed-solomon (RS) codes, which are basic in code logic, are combined.

Although the concatenated codes can realize a high coding gain, an enormous memory capacity is required. This is because the concatenated codes are based on the concept of rearrangement (interleaving) of data described later.

Circuits for performing error correction include a coding circuit and a decoding circuit. The coding circuit is a circuit to calculate a check code and adds it to a signal. The decoding circuit is a circuit to calculate a position, on a signal, of an error mixed on a transmission path and to return it to original data.

In general, when the coding/decoding circuit is mounted in an LSI, a memory is also usually mounted in the same chip. Such a memory is called an ON-CHIP memory. The memory in the LSI takes an area out of a logical circuit, consumes electric power and is liable to become the first cause of heat generation. Further, in a recent tendency, a diagnosis circuit is generally added to the memory, and this memory diagnosis circuit also becomes a problem as a non-negligible heat source.

[Non-patent document 1] ITU-T Recommendation G.709
[Non-patent document 2] ITU-T Recommendation G.975.1

SUMMARY OF THE INVENTION

As stated above, the concatenated codes of the related art require a large amount of memory. This point will be described while the algorithm I3 of Recommendation G.975.1 (hereinafter referred to as G.975.1 I3) is used as an example.

FIG. 2 is a schematic view of G.975.1 I3.

A coding circuit a1 of G.975.1 I3 includes an outer coding circuit a11 and an inner coding circuit a12. The outer coding circuit a11 includes 8 coding circuits a111 of BCH(3860, 3824) code, and the inner coding circuit a12 includes 16 coding circuits a121 of BCH(2040, 1930) code. In FIG. 2, BCH(3860, 3824) code is denoted by BCH_A code, and BCH(2040, 1930) code is denoted by BCH_B code. BCH (3860, 3024) is coded as in Table 1, and BCH(2040, 1930) is coded as in Table 2 in G.975.1 I3.

TABLE 1

| item | content |
|---|---|
| code format | BCH(3860, 3824) code |
| 1 code length | 3860 bits |
| dummy bit length | 220 bits (1 code length + dummy bit length = 4080 bits) |
| arithmetic rule | pursuant to GF(4095) |
| correction function | correctable up to 3 words |

TABLE 2

| item | content |
|---|---|
| code format | BCH(2049, 1930) code |
| 1 code length | 2040 bits |
| dummy bit length | 0 bits |
| arithmetic rule | pursuant to GF(2047) |
| correction function | correctable up to 10 words |

A decoding circuit a2 of G.975.1 I3 includes an outer decoding circuit a21 and an inner decoding circuit a22. The outer coding circuit a21 includes 8 decoding circuits a211 of BCH(3860, 3824) code, and the inner decoding circuit a22 includes 16 decoding circuits a221 of BCH(2040, 1930) code. Incidentally, in the example of Recommendation G.975.1, since the decoding circuit of the concatenated codes performs 3 iterations (repeat, repetition), in accordance with that, the three outer decoding circuits a21 and the three inner decoding circuits a22 are used in the illustrated example.

G.975.1 I3 includes two kinds of formats, that is, a format for an outer coding/decoding circuit (hereinafter referred to as an outer format) and a format for the inner coding/decoding circuit (hereinafter referred to as an inner format). Thus, G975.1 I3 includes interleavers a13, a24 and a25 to convert the outer format into the inner format, and deinterleavers a14 and a23 to convert the inner format into the outer format.

In G.975.1 I3, a method is adopted in which a frame (hereinafter referred to as an OTN frame) according to OTN standards of Recommendation G.709 is divided into 255 segments, and a correction rate is raised while rearrangement in segment units (see, for example, G.975.1, FIG. 1.10) is performed.

FIG. 3 shows a relation between an OTN frame divided into 255 segments and a format of 8 BCH(3860, 3824) codes.

The rearrangement of segments in G.975.1 I3 is performed by rearranging 8 frames. At this time, it is necessary that the interleaver holds data of 8 frames, that is, 32,640×8=261,120 bits in the memory. Besides, the deinterleaver also requires the same amount of memory. For a subsequent description of a general case, the number of frames which are rearranged is denoted by τ (τ=8 in the above example).

The pair of the interleaver a24 and the deinterleaver a14 shown in FIG. 2 is used for improvement of debugging facilities. The OTN frame determined by Recommendation G.709 becomes the outer format in the structure of G.975.1 I3. Thus, the inner format becomes such that the OTN frame is rearranged. When the interleaver a14 and the deinterleaver a24 do not exist, the OTN frame becomes the inner format on the transmission path, and debugging in an analyzer becomes difficult. Thus, in FIG. 2, the interleaver a24 and the deinterleaver a14 are added. Incidentally, the original algorithm of Recommendation G.975.1 does not include the pair of the interleaver a24 and the deinterleaver a14.

For this structure, when the interleaver a24 and the deinterleaver a14 for debugging are removed, the concatenated codes of G.975.1 I3 requires a memory amount of 261,120× 6=1,566,720 bits≈1.5 Mbits (1K=1024, 1M=1024 K). When the interleaver a24 and the deinterleaver a14 for debugging are included, a memory of 261,120×8≈2.0 Mbits is required. As stated above, this memory, together with the coding/decoding circuit, is often mounted in the LSI. In this case, the memory amount of 2.0 Mbits is enormous, occupies a large area of the LSI, consumes electric power, and is liable to become the first cause of heat generation.

In view of the above, an object of the invention is to improve concatenated codes and to provide an arithmetic circuit of concatenated codes and an address control method in which a memory amount is greatly reduced. Besides, another object of the invention is to perform a process, without using an interleaver and a deinterleaver, similar to a case where rearrangement is performed.

According to an aspect of the invention, the algorithm of a coding/decoding circuit of concatenated codes of the related art is basically reviewed, the concatenated codes are improved, and the memory amount is greatly reduced. For example, the concatenated codes are realized without using data conversion which is performed by the interleaver of the related art.

The concatenated codes have a sufficient possibility that the field of application is not limited to the field of optical communication but is widened as a method of obtaining a high coding gain. Thus, it is believed that the present invention remarkably contributes to the improvement of a coding/decoding technique.

According to the first solving means of this invention, there is provided an arithmetic circuit of concatenated codes used for a coding circuit or a decoding circuit, comprising:

an arithmetic section to perform an arithmetic operation for coding or decoding;

a first to a τth (τ is an integer of 2 or more) registers; and an address control section to specify an address of a register to which an arithmetic operation result of the arithmetic section is written among the first to the τth registers, wherein the address control section performs an address control for each frame, in which a first address is changed to switch a writing destination of the arithmetic operation result for a top segment of a frame sequentially and circularly to the first to the τth registers for respective frames, and an address control for each segment, in which a second address is changed to switch a writing destination of the arithmetic operation result for each segment in the frame sequentially and circularly from the register indicated by the first address for the top segment of the frame, in a direction from the τth register to the first register for respective segments, wherein the arithmetic operation result of the arithmetic section is written in the first to the τth registers for the respective segments in accordance with the second address.

According to the second solving means of this invention, there is provided an address control method for registers in an arithmetic circuit of concatenated codes used for a coding circuit or a decoding circuit, comprising the steps of:

performing an arithmetic operation for coding or decoding;

performing an address control for each frame, in which a first address is changed to switch a writing destination of the arithmetic operation result for a top segment of a frame sequentially and circularly to the first to the τth registers for respective frames; and performing an address control for each segment, in which a second address is changed to switch a writing destination of the arithmetic operation result for each segment in the frame sequentially and circularly from the register indicated by the first address for the top segment of the frame, in a direction from the τth register to the first register for respective segments, wherein the arithmetic operation result of the arithmetic section is written in the first to the τth registers for the respective segments in accordance with the second address.

According to the invention, it is possible to improve concatenated codes and to provide an arithmetic circuit of concatenated codes and an address control method in which a memory amount is greatly reduced. Besides, according to the invention, it is possible to perform a process, without using an interleaver and a deinterleaver, similar to a case where rearrangement is performed.

BRIEF DESCRIPTION OF THE DRAWINGS

FIG. 6 is an explanatory view of a relation between each frame, each segment and an address.

DETAILED DESCRIPTION OF THE INVENTION

1. Improved Circuit of Concatenated Codes

In an embodiment, an outer coding/decoding circuit is improved, and an inner coding/decoding circuit can be used as it is. The outer coding/decoding circuit is such that the 8 same coding/decoding circuits of BCH(3860, 3824) are arranged. Thus, the main of the invention is the improvement of the coding/decoding circuit of BCH(3860, 3824). Thus, hereinafter, the improved point of the coding/decoding circuit of BCH(3860, 3824) will be described.

Figure 25:
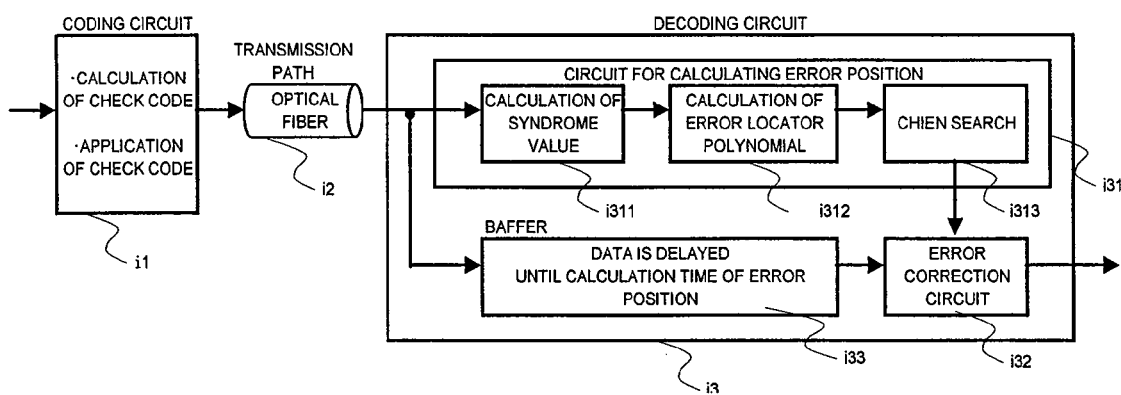
FIG. 25 is a structural view of a coding circuit and a decoding circuit.

FIG. 25 shows a structure of a coding/decoding circuit.

A coding circuit j1 is for calculating a check code and for adding it to input data. A decoding circuit j3 finds an error position from the input data by a circuit j31 and performs correction by a circuit j32 based on the error position. Since the input data is subjected to the error position calculation, a buffer j33 for performing a delay of a period of time for that is required. The circuit j31 to find the error position includes a syndrome arithmetic circuit j311 to obtain a syndrome value, a circuit j312 to calculate an error locator polynomial from the syndrome value, and a chien search circuit j313 to calculate the error position from the error locator polynomial.

Here, in order to explain the principle of an improved algorithm, first, the simplest syndrome arithmetic circuit is used as an example and a description will be made.

In the case of BCH(n, k), that is, when the number of information bits is k and the number of information bits+the number of check code bits is n, when data in units of 1 bit, which passes through an optical fiber j2 and is inputted to the syndrome arithmetic circuit j311, is made $y_{n-1}, y_{n-2}, \ldots, y_1, y_0$, in the case where the number of bits which can be corrected is t, a syndrome polynomial to be obtained is expressed by $$S(z) = s_0 + s_1 z + \ldots + s_{2t-1} z^{2t-1} \quad (1)$$

At this time, the data is inputted to the syndrome arithmetic circuit in descending order of suffix, that is, in order of n−1, n−2, . . . . Here, each coefficient (coefficient value of the syndrome polynomial, syndrome coefficient value) is $$s_j = y_{n-1}(\alpha^j)^{n-1} + \ldots + y_1(\alpha^j)^1 + y_0 \quad (0 \leq j < 2t) \quad (2).$$

$y_{n-1}, y_{n-2}, \ldots, y_1, y_0$ are elements of Galois field GF(2), takes only "1" or "0" as a value, addition and subtraction are equivalent to exclusive OR (xor), and multiplication is equivalent to logical product (and).

Besides, since the BCH code is treated at this time, coefficients have the following relation, and a coefficient with an odd suffix can be represented by a coefficient with an even suffix.

$$s_1 = (s_0)^2, \, s_3 = (s_0)^4, \, s_5 = (s_2)^2, \quad (3)$$

Thus, the arithmetic operation of coefficients in the syndrome arithmetic circuit is performed for only coefficients having even suffixes, and the calculation of coefficients having odd suffixes is performed in a latter stage circuit to calculate an error locator polynomial.

Figure 4:
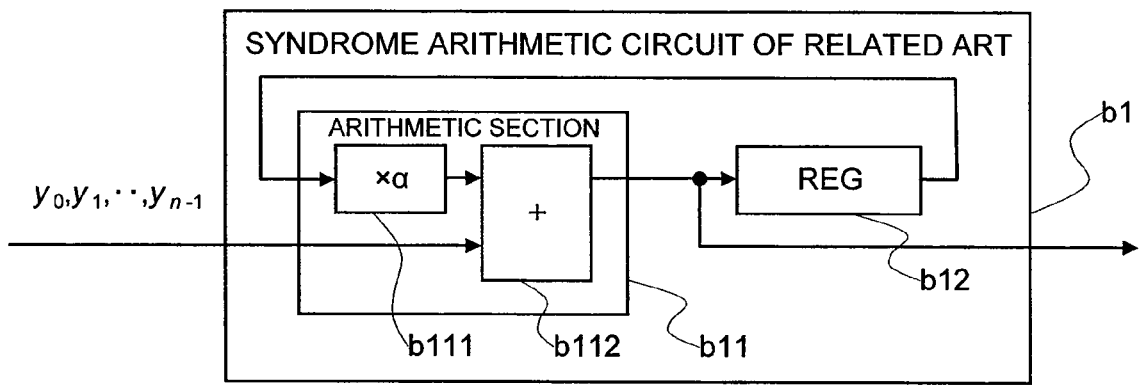
FIG. 4 is a view of a syndrome arithmetic circuit of related art.

FIG. 4 is a view of a syndrome arithmetic circuit of the related art.

The syndrome arithmetic circuit of the related art includes an arithmetic section b11 and a register section b12 as in FIG. 4. Here, the structure of the syndrome arithmetic circuit of the related art will be described in brief. The expression (2) is converted to $$s_j = (\ldots((0 \cdot \alpha^j + y_{n-1}) \cdot \alpha^j + y_{n-2}) \cdot \alpha^j + y_{n-3} \ldots) \cdot \alpha^j + y_0$$
$$(0 \leq j < 2t) \quad (4)$$

As the arithmetic operation, after a Galois field multiplier b111 multiplies a former value by $\alpha^j$, a Galois field adder b112 adds y, and this is repeated n times to obtain $s_j$.

Figure 5:
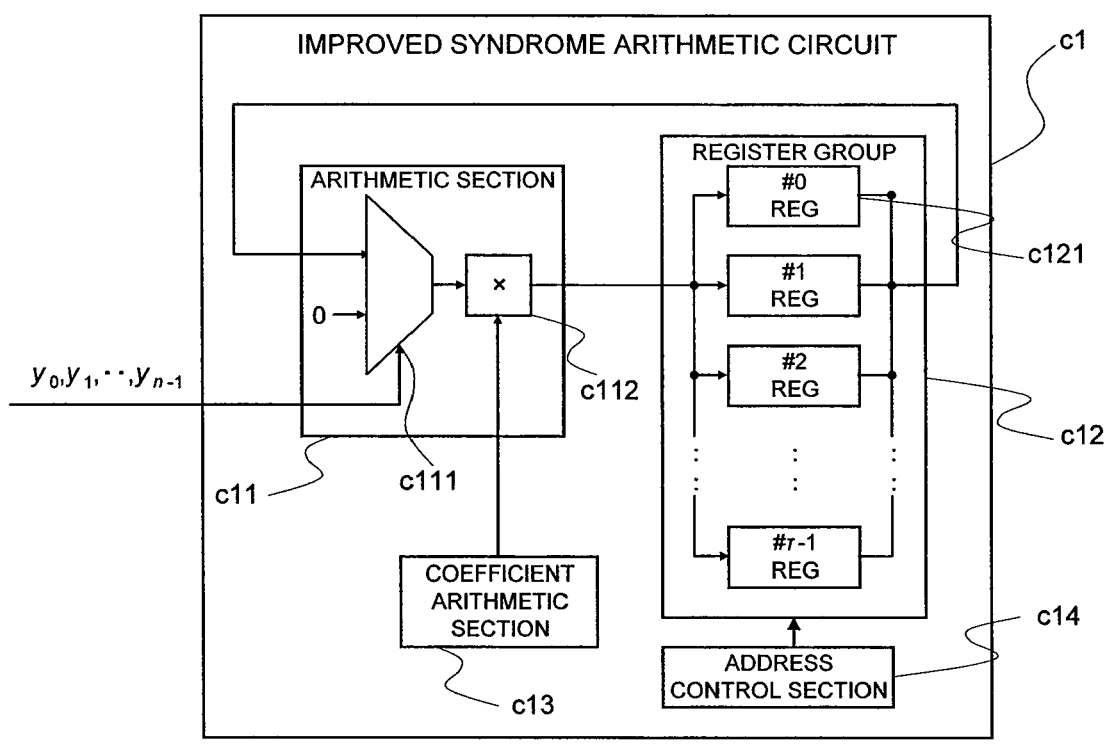
FIG. 5 is a view of an improved syndrome arithmetic circuit.

FIG. 5 is a view of an improved syndrome arithmetic circuit.

At this time, as shown in FIG. 5, the structure of a syndrome arithmetic circuit is made such that τ (τ is an integer of 2 or more) registers c121 are used in a register section c12, and a method described below is used, so that a process similar to a process in which rearrangement is performed can be performed without using an interleaver and a deinterleaver. A syndrome arithmetic circuit c1 includes, for example, an arithmetic section c11, a register group c13 including a plurality of registers c121, a coefficient arithmetic section c13, and an address control section c14. Incidentally, also in the case where the embodiment is applied to an error correction circuit, a check code calculation circuit, a check code adding circuit or the like, the same structure can be adopted. In this case, the arithmetic section c11 is constructed so as to perform a process of error correction or the like, and the coefficient arithmetic section c13 can be omitted.

In this method, a register to be used is changed each time a segment is changed, for example, #τ−1 register is used for the 0th segment, and #τ−2 register is used for the 1st segment. Then, the #τ−1 register is again used for the τth segment. As stated above, when the register to be used is controlled by the address control section c14, when attention is paid to a certain register, the syndrome of segments which are seemingly rearranged is calculated. The register control is realized by two controls described below, that is, an address control for each segment and an address control for each frame.

As a specific example, with respect to this case (τ=8), the address control for each segment and the address control for each frame will be described by use of FIG. 6. The address control for each segment is the address control in a certain frame. For example, in the 0th frame of FIG. 6, reference is made to #7 register for the 0th segment, reference is made to #6 register for the 1st segment, and reference is made again to the #7 register for the 8th segment. The number of the memory to which reference is made, that is, the address is circularly changed like 7, 6, 5, . . . , 0, 7, 6, . . . . This control is continued to the 241th segment. From the 242th segment, since only a dummy bit is included (see FIG. 3), this control may not be performed.

The address control for each frame is the address control for consecutive frames. The address of the 0th segment of the 1st frame is calculated from the 0th segment of the former frame. In the example of FIG. 6, it is understood that the address of the 0th segment of each frame is circularly changed like 7, 0, 1, . . . , 6, 7, 0 . . . .

The register control of the improved syndrome arithmetic circuit is performed in such a way that first, in each frame, the address control for each frame is performed only for the 0th segment, and the address control for each segment is performed for segments other than the 0th segment. By this method, for example, in the arithmetic operation of the frame in which attention is paid to the #7 register of FIG. 6, a target syndrome value is given at the 239th segment of the 7th frame.

However, when this method is used, there is one point to which attention must be paid. When viewed from the #7 register, first, in the 0th frame of FIG. 6, input data of the 0th segment is calculated, and next, an arithmetic operation is performed at the 8th segment. In this case, data in the #7 register is not changed for the 1st to the 7th segments. In the method of the related art, from expression (4), each time data is inputted, $\alpha^j$ is multiplied to calculate the coefficients $(\alpha^j)^{n-1}, (\alpha^j)^{n-2}, \ldots, (\alpha^j)^1$ for $y_{n-1}, y_{n-2} \ldots, y_1$. However, in this method, coefficients for the 1st to the 7th segments can not be obtained. In this embodiment, as a method of solving this problem, the coefficient arithmetic section c13 is provided as shown in FIG. 5. In the coefficient arithmetic section c13, since the coefficient is obtained like $(\alpha^j)^{n-1}, (\alpha^j)^{n-2}, (\alpha^j)^{n-3} \ldots$, each time data is inputted, it is divided by $\alpha^j$. That is, in the method of the related art, although $\alpha^j$ is multiplied in order to calculate each coefficient, in the method of this embodiment, the reverse thereof is performed.

One of superior points of this method is that the data itself is not rearranged. That is, there is a merit that an interleaver and a deinterleaver, which are required in the related art, become unnecessary. On the other hand, as in the case where data is rearranged using the interleaver and the deinterleaver, there is a merit that even if an error exceeding error correcting capability occurs in a frame, error correction can be performed decentrally.

Figure 18:
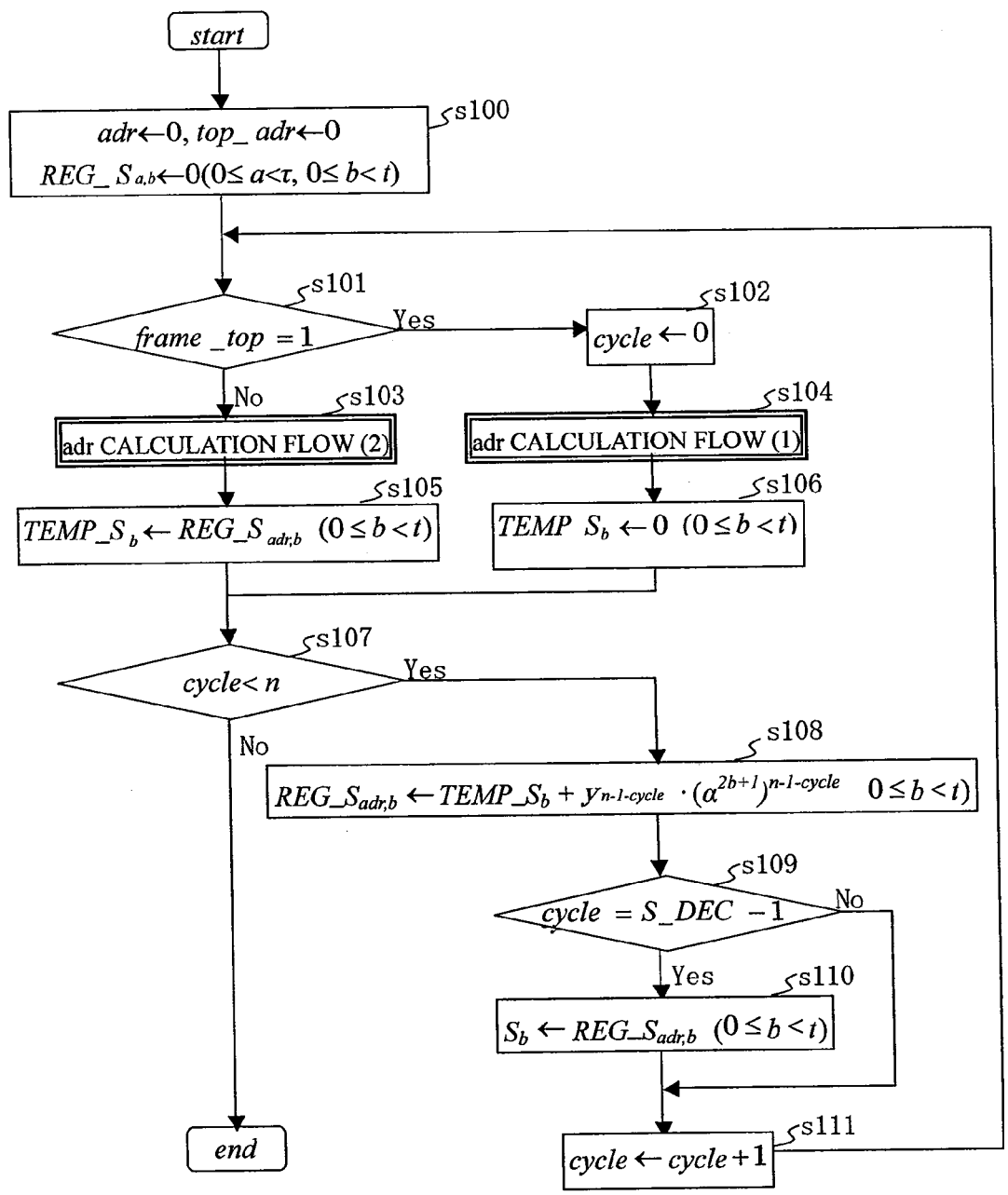
FIG. 18 is a flowchart of an improved syndrome arithmetic operation.

Next, an algorithm of the syndrome arithmetic circuit operating in this principle will be described by use of a flowchart of FIG. 18. Until now, BCH(3860, 3824) is used as a specific example and the description is made, however, from here, a general description will be made. Here, values used in the flowchart are as follows. Incidentally, in the flowchart of FIG. 18, a 1-cycle operation is performed for information of 1 bit.
cycle: cycle number.
S_DEC: cycle in which a syndrome coefficient value is decided.
n: the number of signal bits+the number of check code bits.
τ: the number of rearranged frames.
t: the number of correctable maximum words.
η: the number of bits per 1 segment.
REG_$S_{a,b}$: register ($0 \leq a < \tau$, $0 \leq b < t$)
adr: address (second address) of a register, ($0 \leq adr < \tau$).
frame_top: signal indicating the top of a frame.
top_adr: address (first address) at frame top.
$y_j$: 1-bit input data ($0 \leq j < n$).
$S_b$: syndrome coefficient (output value) ($0 \leq b < t$).

First, initialization is performed at s100. Here, REG of FIG. 5 is newly denoted by REG_$S_{a,b}$ ($0 \leq a < \tau$, $0 \leq b < t$). Here, "a" is a suffix representing an address, and "b" is a suffix representing a coefficient of a syndrome polynomial. The address for REG_$S_{a,b}$ is denoted by adr and is initialized. Besides, top_adr denotes an address at the 0th segment in each frame. Incidentally, the initialization of s100 is equivalent to an operation after reset in a circuit.

Next, at the branch of s101, it is determined whether the top of a frame appears. Here, in the case of the top, frame_top=1 is established, and in the case of not the top, frame_top=0 is established. In the flowchart of FIG. 18, the counter value is denoted by cycle, and the value is made 0 at s102.

Figure 19:
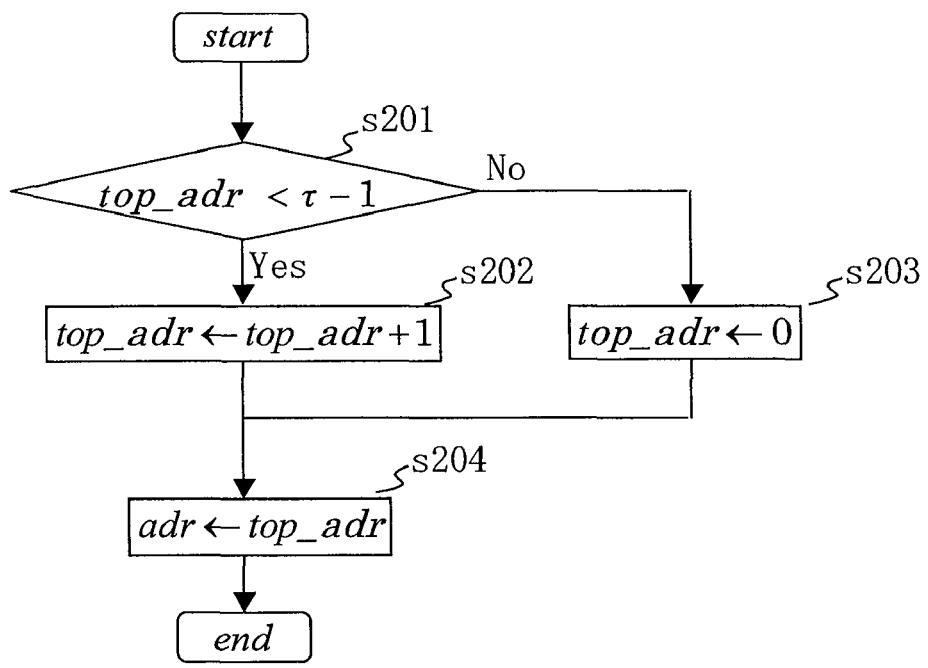
FIG. 19 is a flowchart of address control (address control for each frame) at the top of a frame.

Next, the address control is performed. In the case of frame_top=1, the address control for each frame is performed (s104). A flowchart of FIG. 19 shows the address control for each frame in a general case. Since the flowchart of FIG. 19 functions only for frame_top=1 where the top of the frame appears, the value of top_adr is not changed in the other case. At steps s201 to s203, top_adr is updated. Besides, in order to deliver the value here to the flowchart of FIG. 18, the updated value is substituted for the address adr of the register (s204).

Figure 20:
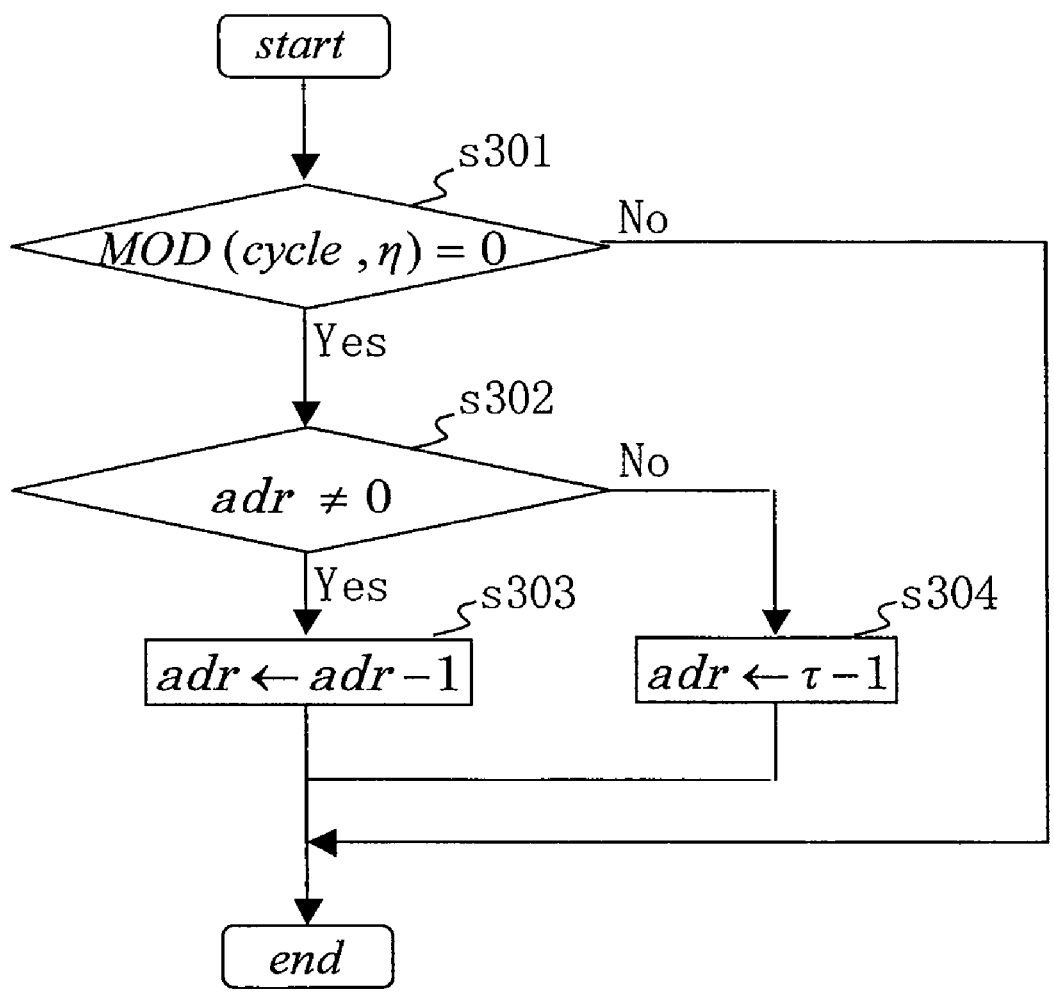
FIG. 20 is a flowchart of address control (address control for each segment) in the case of not the frame top.

In the case of frame_top=0, the address control for each segment is performed (s103). A flowchart of FIG. 20 shows the address control for each segment. However, the address adr is changed for each segment, at s301, it is determined whether the delimiter of a segment appears. For example, when the number of bits per 1 segment is η, it functions only when the cycle is dividable by η. At s302 to s304, adr is updated.

In the case of frame_top=1, in order to clear the value in the register, the process of s106 is performed. In the other case, the calculated value REG_$S_{adr,b}$ indicated by the address adr is read as shown at s105. The read value is substituted for TEMP_$S_b$. This value is a temporal variable used for subsequent s108.

Figure 1:
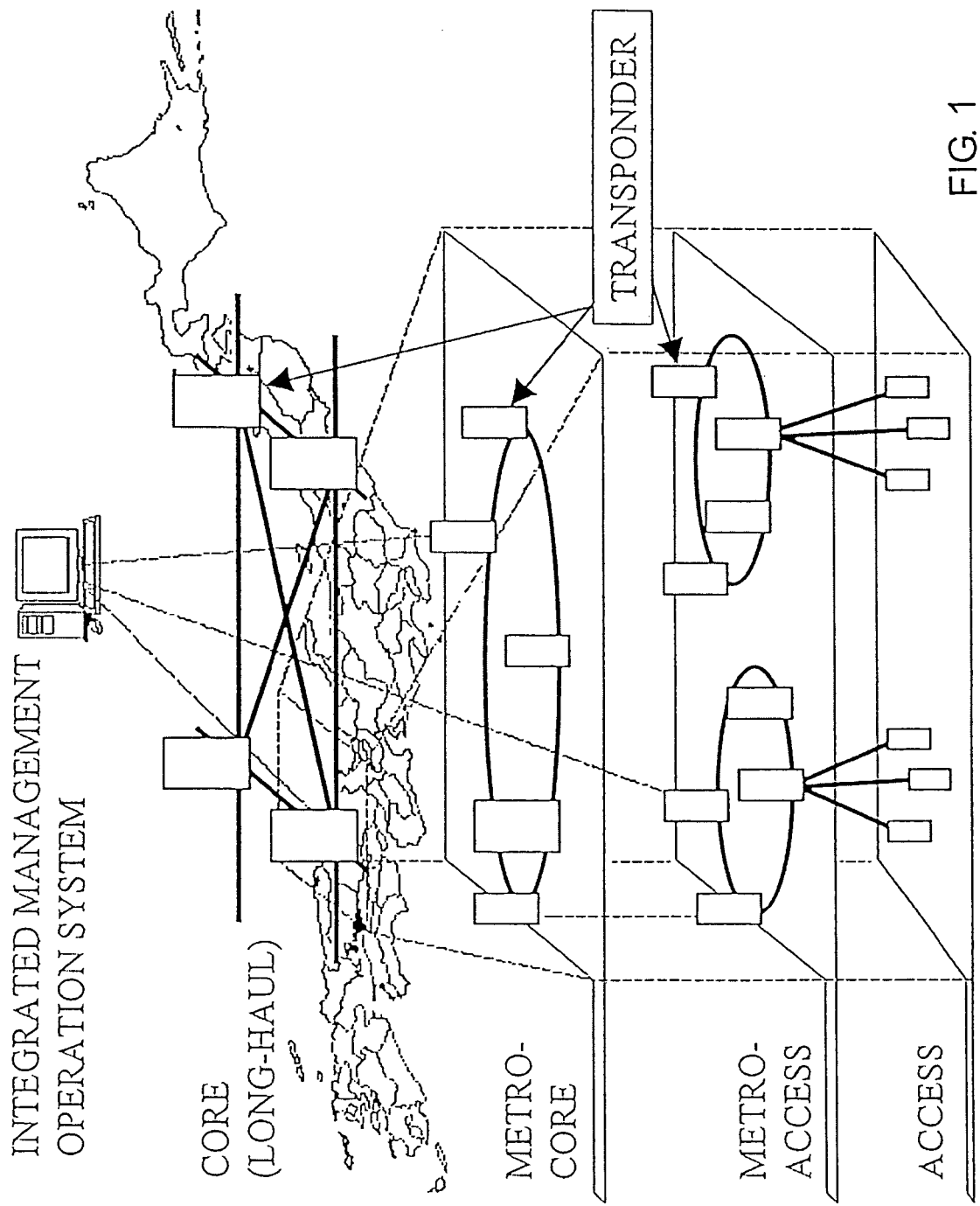
FIG. 1 is an explanatory view of a relation between a hierarchical structure of a transmission network in NGN and an optical transport system.
Figure 2:
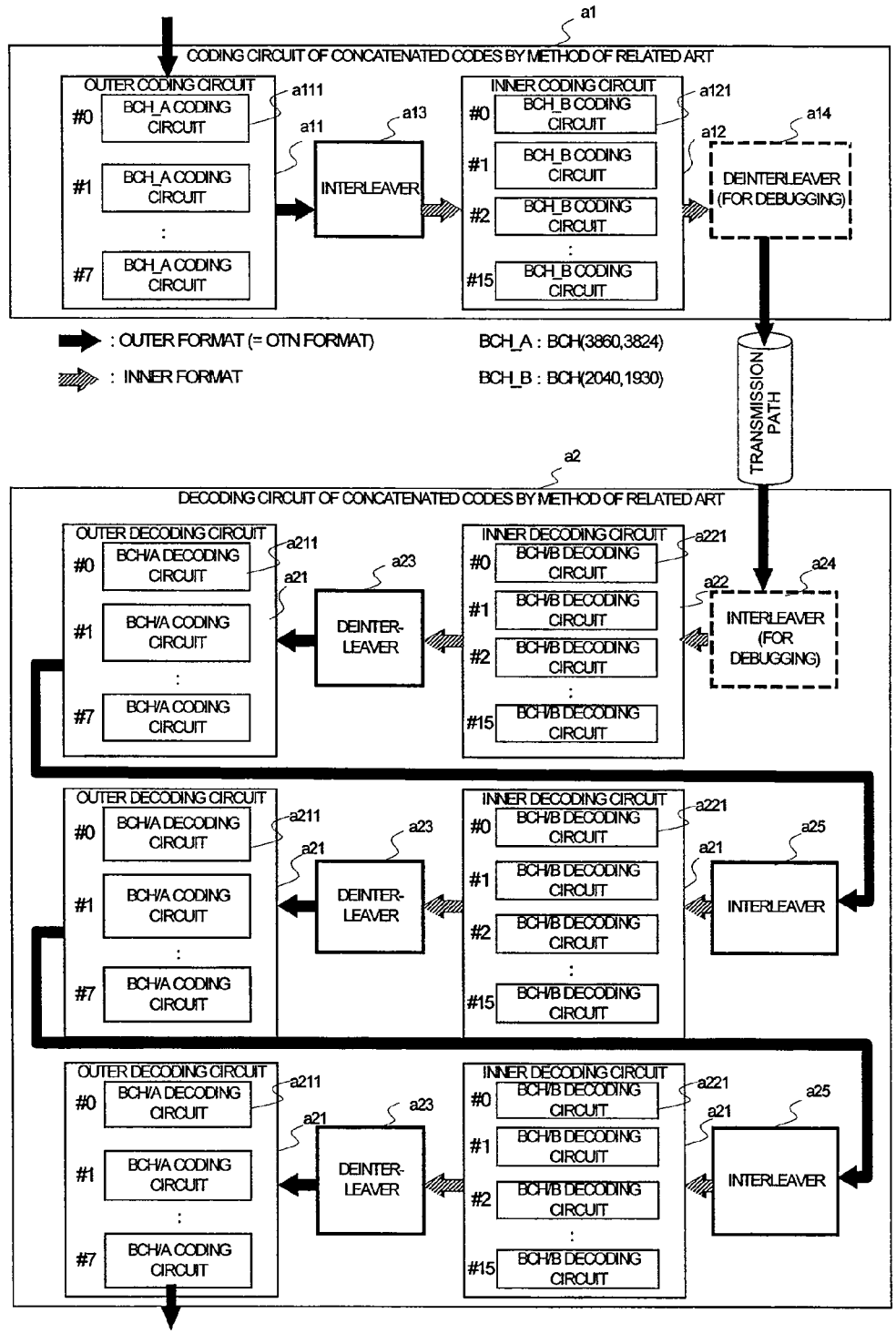
FIG. 2 is a circuit structural view (G.975.1 I3) of concatenated codes by a method of related art.
Figure 3:
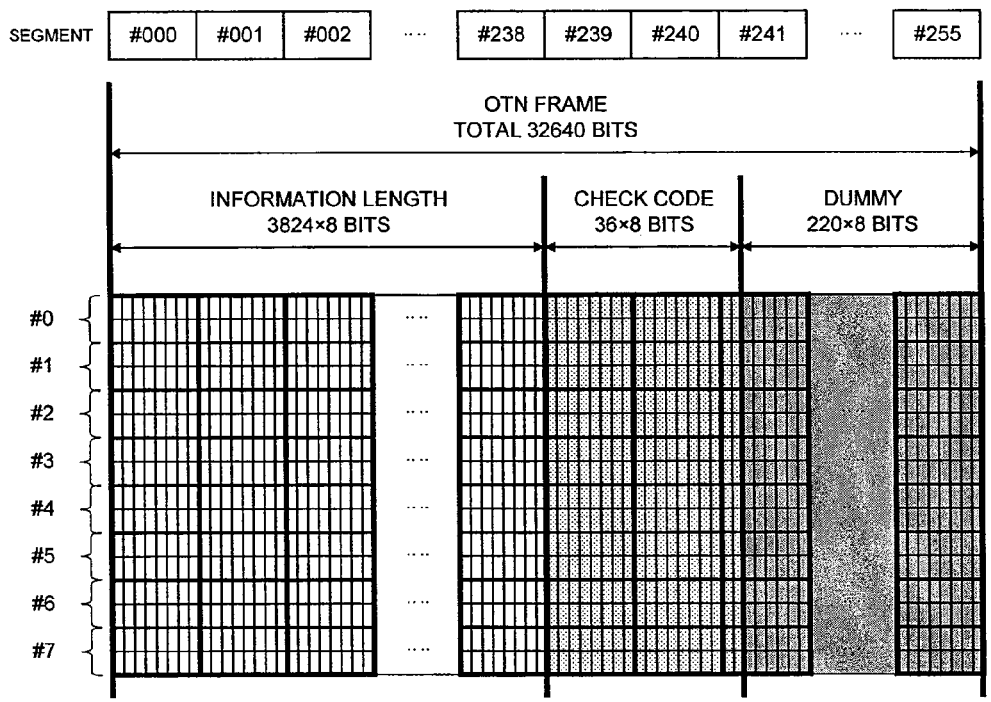
FIG. 3 is an explanatory view of a relation between an OTN frame and a format of 8 BCH(3860, 3824) codes.

As shown in FIG. 3, data requiring an operation is only an information section and a check code section, and a dummy section does not require an operation, and therefore, the arithmetic operation is ended at cycle=n. Step s107 is a process to calculate only the information section and the check code section.

Step s108 shows Galois field arithmetic operation of expression (2). However, attention must be paid to a point that the index of a coefficient required for the operation is decreased according to an input value like $(\alpha^j)^{2n-1}, (\alpha^j)^{2n-2}, (\alpha^j)^{2n-3}$. Thus, the coefficient is obtained by performing a division separately in the coefficient arithmetic section c13. Incidentally, the calculated value is again written in REG_$S_{adr,b}$ indicated by the address adr.

Thereafter, at s109, when a position becomes a segment position where a syndrome coefficient value is decided, the value of REG_$S_{adr,b}$ is substituted for the syndrome coefficient value S. In the flowchart of FIG. 18, the decided segment position is denoted by S_DEC.

Figure 7:
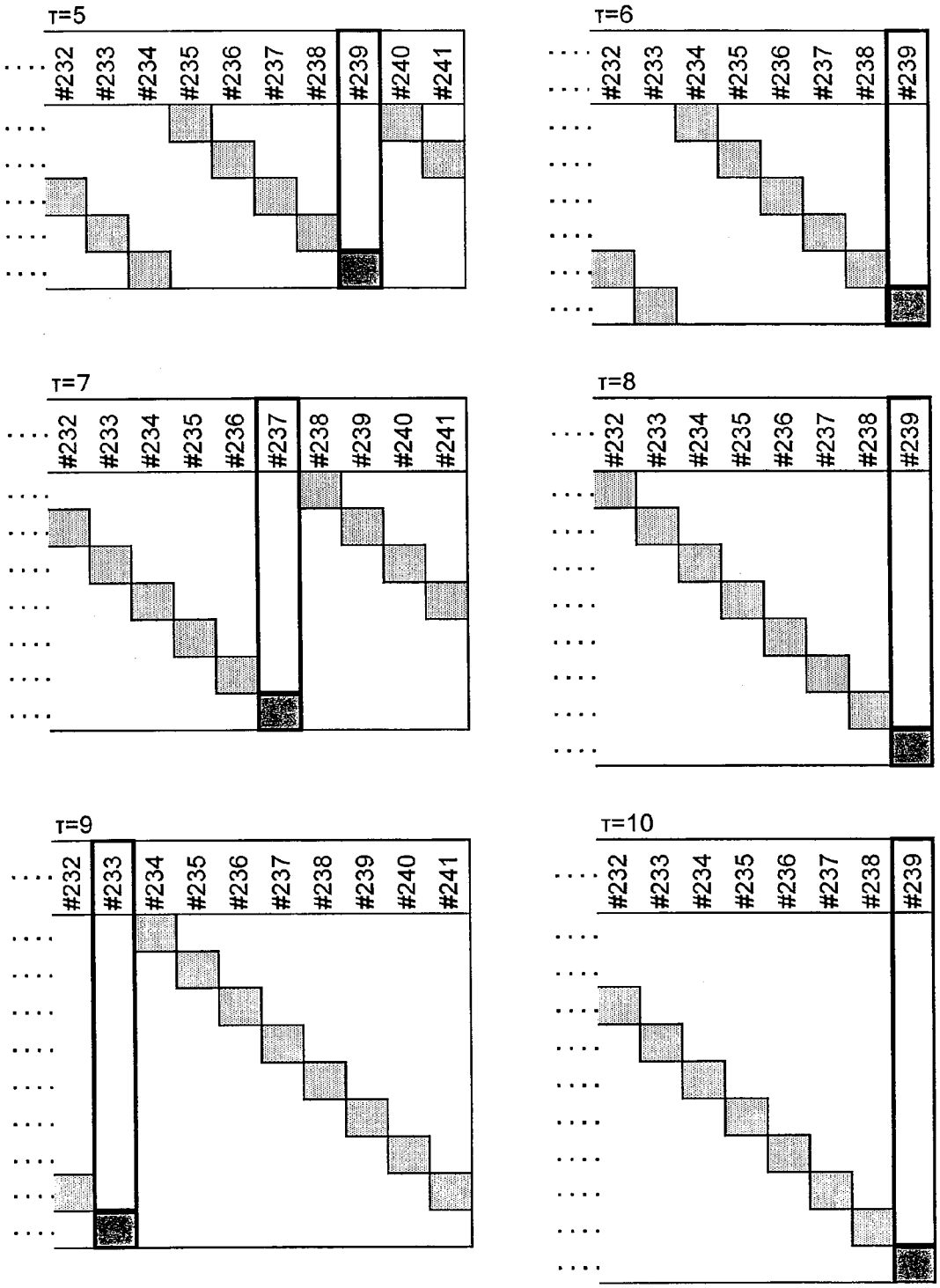
FIG. 7 is an explanatory view of an end position of a syndrome arithmetic operation according to each τ in the case of BCH(3860, 3824).

The segment position S_DEC where the syndrome coefficient value is decided varies according to the value of τ. As shown in FIG. 7, for example, in the case of η=16 for BCH (3860, 3824), the syndrome coefficient value is decided at the 239th segment for τ=5, 6, 8 and 10, at the 237th segment for τ=7, and at the 233th segment for τ=9.

In a general case, the value of S_DEC is obtained as described below. First, $\xi_s$ is defined as follows.

$$\xi_s = n \div \eta \qquad (5)$$

At this time, when n is dividable by η, $$S\_DEC = \xi_s - MOD(\xi_s, \tau) \qquad (6)$$

When n is not dividable by η, $$S\_DEC = (\xi_s + 1) - MOD((\xi_s + 1), \tau) \qquad (7)$$

Here, MOD($\xi_s$, τ) and MOD(($\xi_s$+1), τ) represent the remainders obtained when $\xi_s$ and ($\xi_s$+1) are respectively divided by τ. When the case in G.975.1 I3 is applied to the above expression, S_DEC=240, that is, the 239th segment is obtained.

However, S_DEC denotes the segment position where the value of the present syndrome coefficient is decided, and as a circuit, as long as cycle<n is established, it is necessary to continue the arithmetic operation. When cycle≧n is established, the flowchart of FIG. 18 is ended.

As described above, the operation result equal to that obtained when rearrangement is performed can be derived without requiring the interleaver and the deinterleaver. Incidentally, a portion requiring this method is the syndrome arithmetic circuit and the error correction circuit, which are a part of the coding circuit and the decoding circuit. Incidentally, it is necessary that the calculation circuit of the error locator polynomial is slightly changed as stated above. For example, by using expression (3), a syndrome coefficient with an odd suffix is calculated from that with an even suffix. The chien search circuit remains the same as that of the related art.

Figure 21:
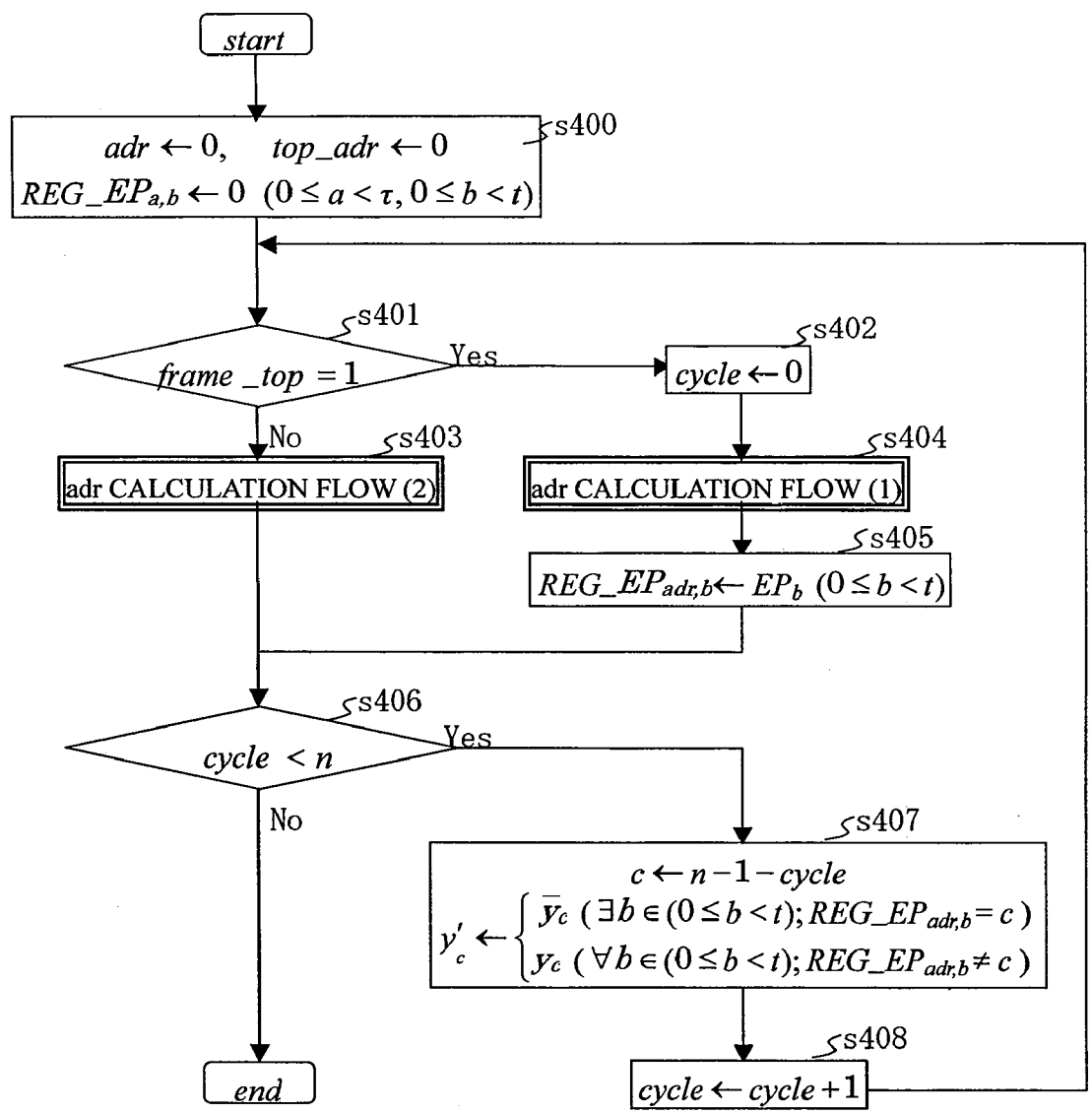
FIG. 21 is a flowchart of an improved error correction method.

Next, the flow of the error correction circuit (j32, i211) will be described by use of the flowchart of FIG. 21. Here, respective values are as follows.

$EP_b$: position of error ($0 \leq b < t$), an input value of the error correction circuit.
$REG\_EP_{a,b}$: register ($0 \leq a < \tau$, $0 \leq b < t$).
$y_j$: 1-bit input data ($0 \leq j < n$).
$y'_j$: 1-bit output data ($0 \leq j < n$).
The other values are the same as those of the flowchart of FIG. 18.

The error correction circuit j32 receives the position of an error as the input value from the former stage chien search circuit j313. A large difference from the flowchart of FIG. 18 is a process of s407, and there is no large change in other portions. The basis is such that $\tau$ registers are prepared, and the same address control is performed. Incidentally, when the process of s407 is written in detail, when c is made c=n−1−cycle, one of $REG\_EP_{adr,b}$ ($0 \leq b < t$) is equal to c, that is, it is meant that only when $$(REG\_EP_{adr,0}=c) \text{ or } (REG\_EP_{adr,1}=c) \text{ or } \ldots \text{ or } (REG\_EP_{adr,\tau}=c) \tag{8}$$

is true, the input value $y_j$ is inverted and is outputted as $y'_j$.

Figure 17:
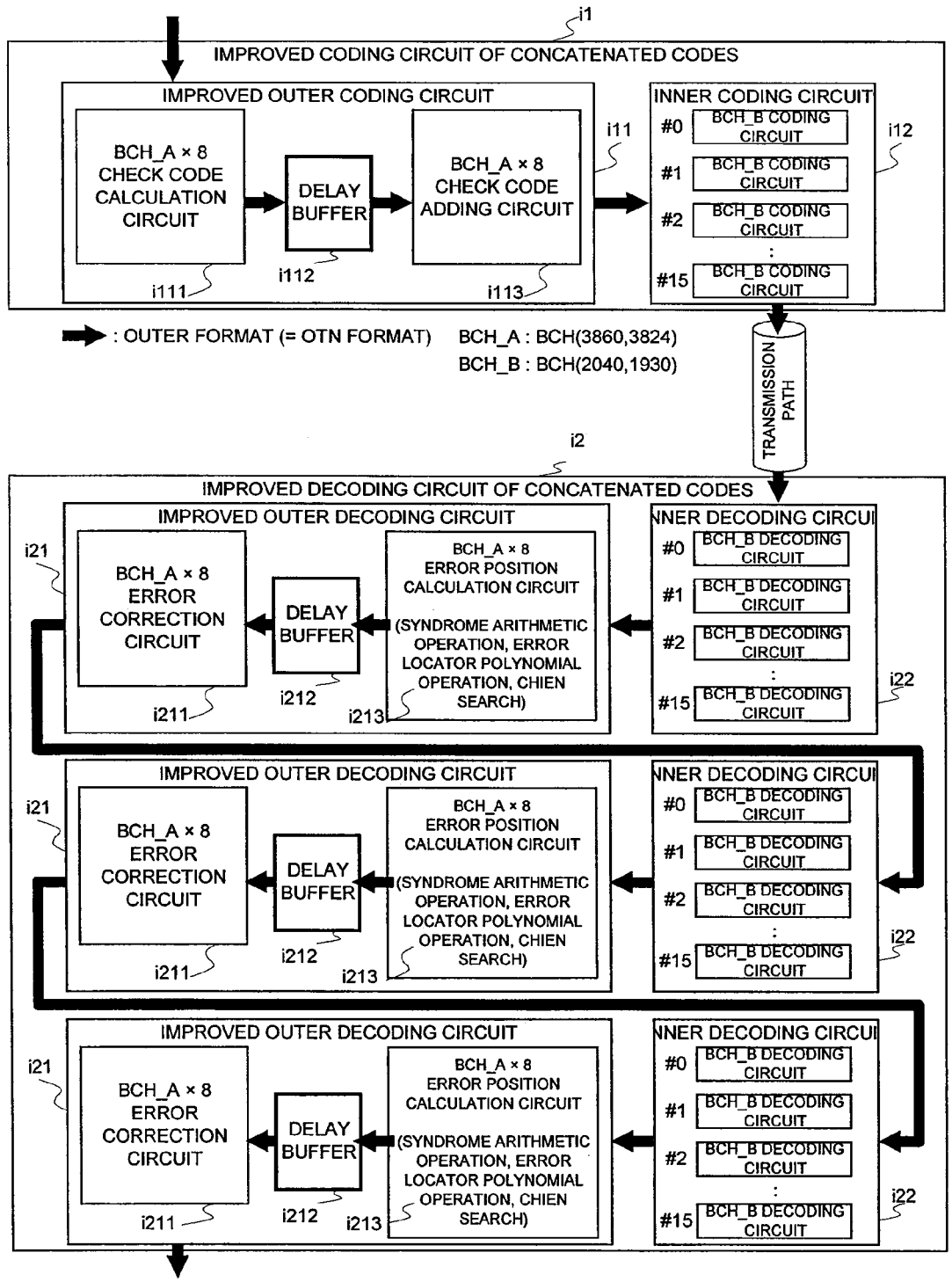
FIG. 17 is a structural view of concatenated codes using an improved outer coding/decoding circuit.

Next, the flow of the improved coding circuit will be described. For example, as shown in FIG. 17, an improved coding circuit i11 is divided into a check code calculation circuit i111 to calculate a check code from an input signal, and a check code adding circuit i113 to add the check code to the input signal, and those are connected to each other through a buffer i112.

First, a calculation portion of the check code will be described. I(x) of BCH(n, k) denotes a communication polynomial and is defined as follows.

$$I(x) = i_{k-1}x^{k-1} + i_{k-2}x^{k-2} + \ldots + i_1 x + i_0 \tag{9}$$

Here, the coefficient $i_j$ is an element of GF(2), and takes only "1" or "0" as a value. The letter "m" is defined as m=n−k, and I'(x) is defined as an expression in which I(x) is multiplied by $x^m$, that is, $$I'(x) = x^m I(x) = i_{k-1}x^{n-1} + i_{k-1}x^{n-1} + \ldots + i_1 x^{m+1} + i_0 x^m \tag{10}$$

Next, a general polynomial $$G(x) = g_m x^m + g_{m-1} x^{m-1} + \ldots + g_1 x + g_0 \tag{11}$$

is defined. The coefficient $g_p$ ($0 \leq p \leq m$) is also an element of GF(2), and takes only "1" or "0" as a value. The addition and subtraction are equivalent to exclusive OR (xor), and the multiplication is equivalent to logical product (and). Incidentally, in the case of the general polynomial, the coefficient of the highest degree is always "1", the expression (11) is modified to $$G(x) = x^m + g_{m-1} x^{m-1} + \ldots + g_1 x + g_0 \tag{12}$$

In Recommendation G.975.1, the general polynomial of the BCH(3860, 3824) is $$G(x) = x^{36} + x^{30} + x^{27} + x^{25} + x^{23} + x^{22} + x^{19} + x^{18} + x^{13} + x^{12} + x^{11} + x^6 + x^2 + 1 \tag{13}$$

As described below, when I'(x) is divided by G(x), $$I'(x) \div G(x) = Q(x), \text{ with } P(x) \text{ remainder} \tag{14}$$

and when Q(x) denotes the quotient, and P(x) denotes a polynomial indicating the remainder, P(x) becomes the check code polynomial, and the highest degree is m−1.

Figure 8:
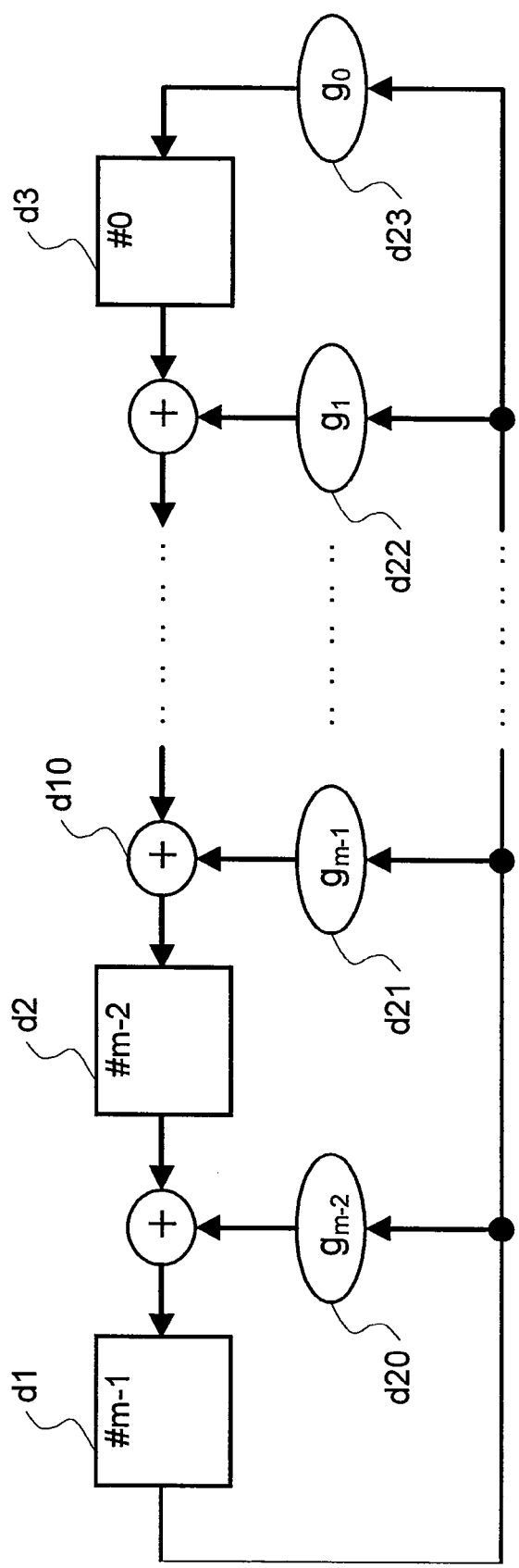
FIG. 8 is a structural view of a shift register for obtaining a check code.
Figure 9:
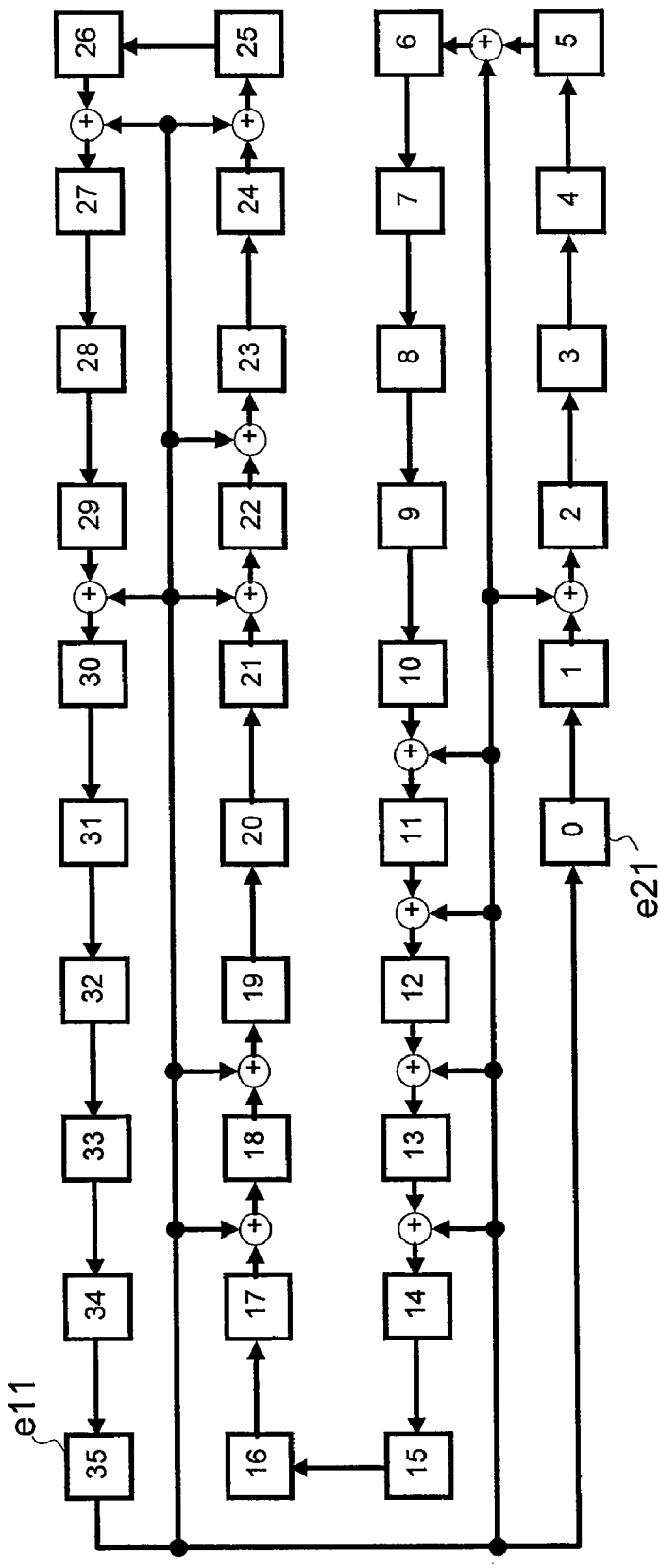
FIG. 9 is a structural view of a shift register of BCH(3860, 3824) using a general polynomial of Recommendation G.975.1.

In general, when the check code is obtained, a circuit called a shift register and as shown in FIG. 8 is used. This circuit includes m 1-bit registers, and when a coefficient g is 0, it is meant that each wire connection (d20, d21, d22, d23 of FIG. 8) is not connected. For example, in the case of BCH(3860, 3824), from expression (13), the circuit includes 36 1-bit registers as shown in FIG. 9.

When "1" is put in the 0th register e12 of FIG. 9 and "0" is put in the other registers, the values of the respective registers become as follows.

shifted 0 times:
000000000000000000000000000000000001 (15)

In this numerical sequence, the leftmost value indicates the value of the 35th register e11, and the rightmost value indicates the value of the 0th register e12. When this circuit is shifted once, the values of the registers are changed as follows.

shifted once:
000000000000000000000000000000000010 (16)

When this shifter is shifted 36 times, the values become as follows.

shifted 36 times:
000001001010110011000111100001000101 (17)

At this time, the value of the pth register of the shift register which is shifted q times is defined as $\gamma_{q,p}$ as stated below. Here, the value of the pth register as the initial value (shifted 0 times) is made $$\gamma_{0,p} = 1 \ (p=0) \tag{18}$$

$$\gamma_{0,p} = 0 \ (1 \leq p < m) \tag{19}$$

Besides, the value has a following relation with respect to the general polynomial G(x).

$$\gamma_{m,p} = g_p \ (0 \leq p < m) \tag{20}$$

Actually, when expressions (13) and (17) are compared, $$\gamma_{36,p} = g_p \ (0 \leq p < 36) \tag{21}$$

When this operation is further continued, at 4094th time, the values become shifted 4094 times:
100000100101011001100011110000100010 (22)

Here, the circuit is shifted once more, the values become as follows.

shifted 4095 times:
000000000000000000000000000000000001 (23)

When the circuit is shifted 4095 times, the values are returned again to the values at the time when the circuit is shifted 0 times.

Figure 10:
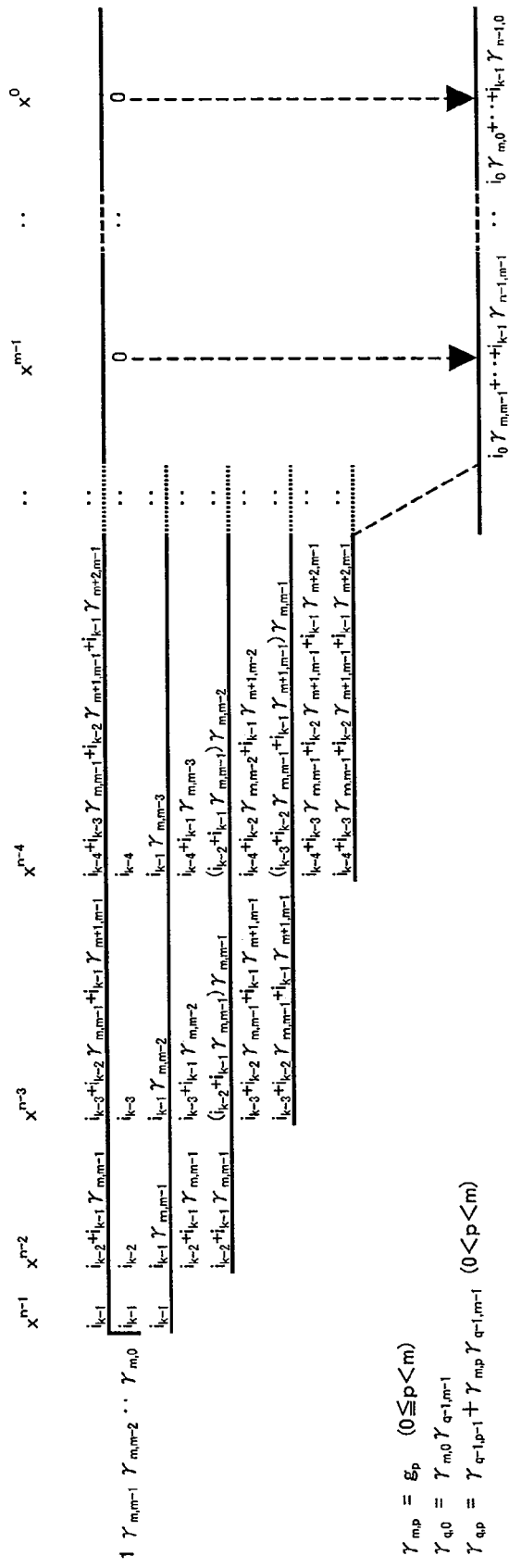
FIG. 10 is an explanatory view of an arithmetic operation of I'(x)÷G(x) using $\gamma_{q,p}$ and its result.

At this time, when I'(x)÷G(x) is performed using $\gamma_{q,p}$ defined in expressions (18) and (19), the division of the polynomials becomes as shown in FIG. 10. Incidentally, FIG. 10 shows an arithmetic operation of only coefficients, and P(x) becomes as follows.

$$P(x) = p_{m-1}x^m + p_{m-1}x^{m-1} + \ldots + p_1 x + p_0 \quad (24)$$

Here, p denotes each coefficient, and when $\gamma_{q,p}$ is used, p becomes as follows.

$$p_{m-1} = i_0 \gamma_{m,m-1} + i_1 \gamma_{m+1,m-1} + \ldots + i_{k-2} \gamma_{n-2,m-1} + i_{k-1} \gamma_{n-1,m-1}$$

$$p_{m-2} = i_0 \gamma_{m,m-2} + i_1 \gamma_{m+1,m-2} + \ldots + i_{k-2} \gamma_{n-2,m-2} + i_{k-1} \gamma_{n-1,m-2}$$

$$p_1 = i_0 \gamma_{m,1} + i_1 \gamma_{m+1,1} + \ldots + i_{k-2} \gamma_{n-2,1} + i_{k-1} \gamma_{n-1,1}$$

$$p_0 = i_0 \gamma_{m,0} + i_1 \gamma_{m+1,0} + \ldots + i_{k-2} \gamma_{n-2,0} + i_{k-1} \gamma_{n-1,0} \quad (25)$$

Figure 11:
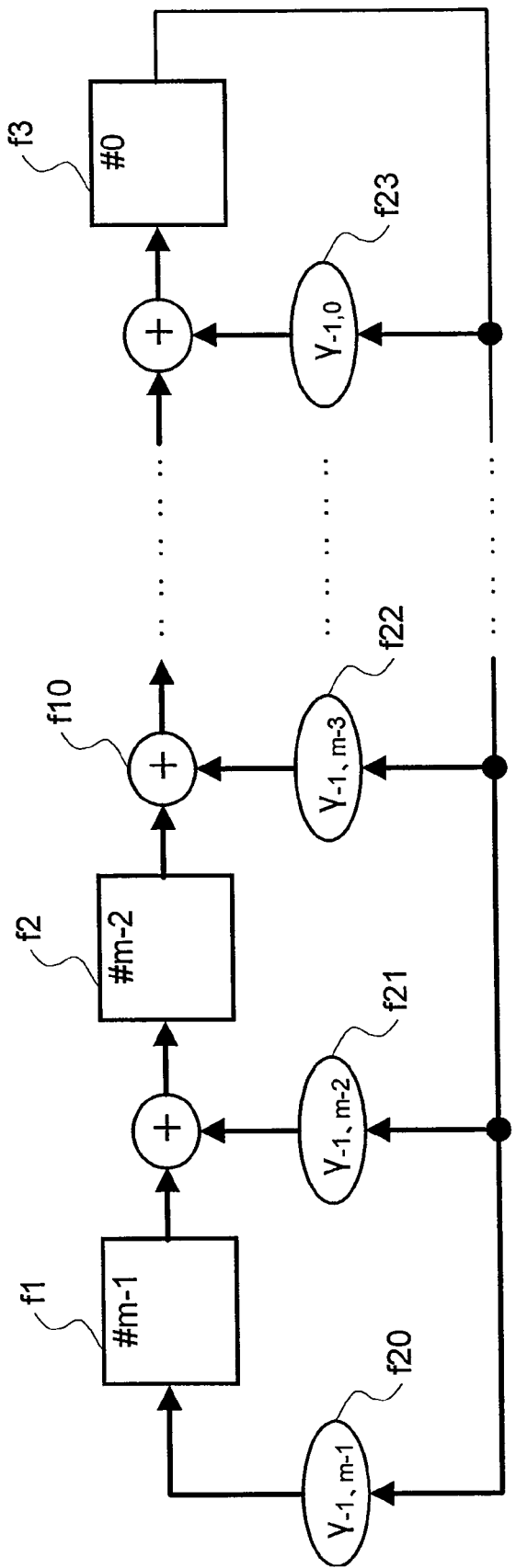
FIG. 11 is a structural view of a shift register which shifts in the reverse direction.
Figure 12:
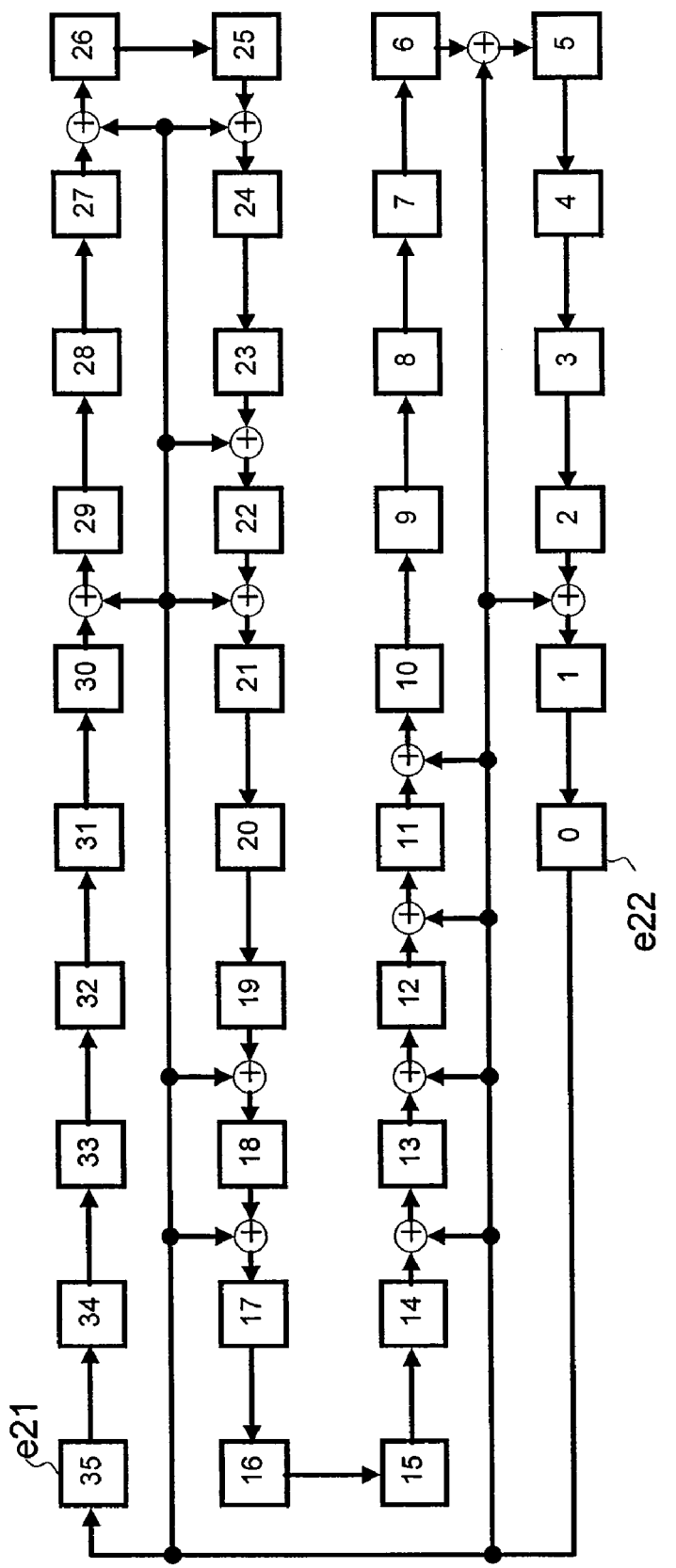
FIG. 12 is a structural view of a reverse shift register of BCH(3860, 3824) using a general polynomial of Recommendation G.975.1.

At this time, it is necessary to pay attention to the following. The value i enters from the (k−1)th. In this embodiment, when a check code is obtained, a shift register which shifts in the reverse direction to the foregoing order is required. For example, a shift is made in a direction of from a higher degree term of a general polynomial to a lower degree term. The reason is that the arithmetic operation of the syndrome arithmetic circuit by the new method is reverse to that of the related art. The shift register which shifts in the reverse direction can be expressed as shown in FIG. 11. The value $\gamma_{-1,p}$ of wire connections f20, f21, f22 and f23 of FIG. 11 indicates the value one shift before, in which the value is returned to the origin after one round. For example, the value is $\gamma_{-1,p} = \gamma_{6,p}$ for GF(7), $\gamma_{-1,p} = \gamma_{14,p}$ for GF(15), and $\gamma_{-1,p} = \gamma_{4094,p}$ for GF(4095). In this case, when a shift register to reverse the order is created based on the general polynomial of Recommendation G.975.1, it becomes as shown in FIG. 12.

Figure 22:
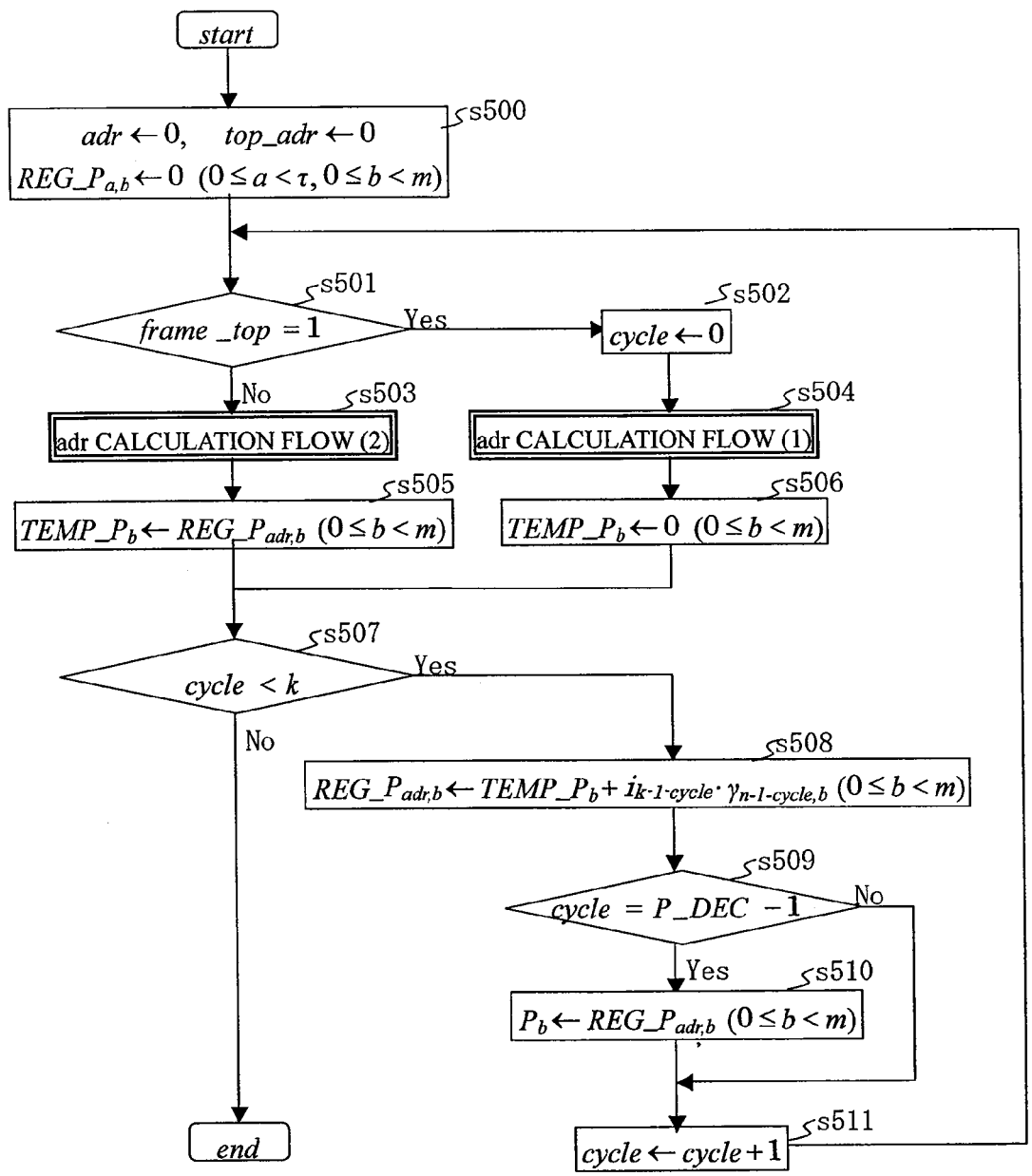
FIG. 22 is a flowchart of calculation of an improved check code.

The calculation flow of a check code using the shift register to reverse the order is a flowchart of FIG. 22. Here, respective coefficients are as follows.
P_DEC: cycle where a check code bit is decided.
k: the number of signal bits.
m: the number of check code bits (n−k).
REG_P$_{a,b}$: register (0≦a<τ, 0≦b<m).
i$_j$: 1-bit input data (0≦j<k).
P$_b$: check code bit (output value) (0≦b<m).
Other values are the same as those of the flowchart of FIG. 18.

In the flowchart of FIG. 22, the arithmetic operation of s508 performs a shift opposite to the normal as stated above.

Here, step s509 will be described. The step s509 is for confirming whether the position P_DEC of the segment where the value of the check code is decided is coincident with the cycle number, and in a general case, the value of P_DEC is obtained as described below. As in the case where S_DEC is defined, first, $\xi_p$ is defined as follows.

$$\xi_p = k + n \quad (26)$$

At this time, when k is dividable by η, $$P\_DEC = \xi_p - MOD(\xi_p, \tau) \quad (27)$$

When k is not dividable by η, $$P\_DEC = (\xi_p + 1) - MOD((\xi_p + 1), \tau) \quad (28)$$

When the case of G.975.1 I3 is applied to the above expression, P_DEC=232, that is, the 231th segment is obtained.

As stated above, when the flowchart of FIG. 22 is used in which the improved coding circuit is divided into the check code calculation circuit and the check code adding circuit, τ frames (accurately, τ−1 frames+P_DEC) are required for calculation of the check code. Thus, it is necessary to input delayed data, and a delay buffer becomes necessary. Originally, although the delay is τ−1 frames+P_DEC, for simplifying the circuit structure, data for τ frames is delayed in the buffer, and the data is made the input to the check code adding circuit.

Figure 23:
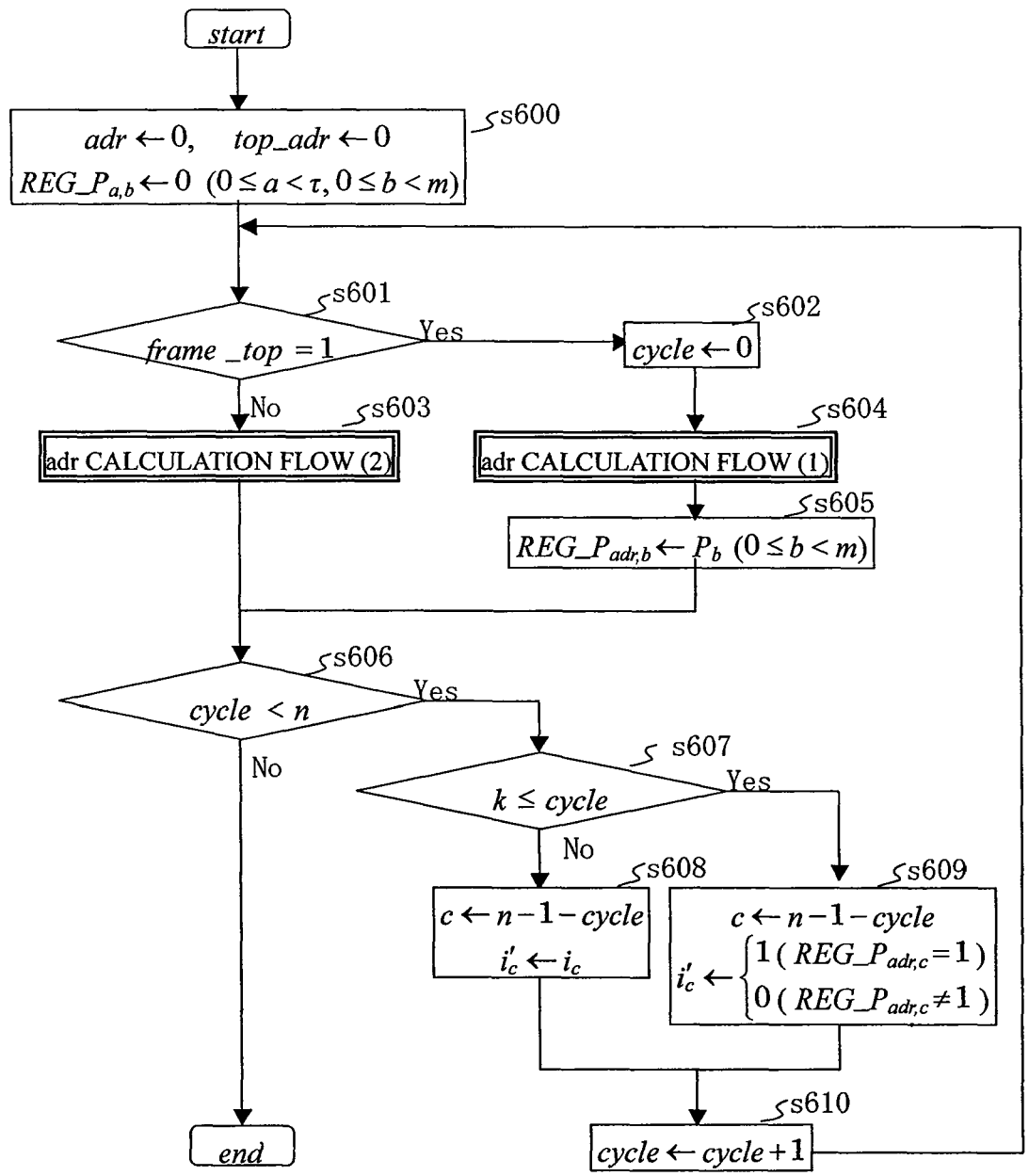
FIG. 23 is a flowchart of addition of an improved check code.

A method of adding the check code is a flowchart of FIG. 23. Here, an input value is such that the output value of the check code calculation circuit (P$_b$ of the flowchart of FIG. 22) is shifted by τ frames. Here, respective coefficients are as follows:
k: the number of signal bits.
m: the number of check code bits (n−k).
REG_P$_{a,b}$: register (0≦a<τ, 0≦b<m).
i$_j$: 1-bit input data (0≦j<n).
i'$_j$: 1-bit output data (0≦j<n).
P$_b$: check code bit. An input value (0≦b<m) from the check code calculation circuit.
Other values are the same as those of the flowchart of FIG. 18.

Only in the case of k≦cycle<n, the check code is added to the signal. This process corresponds to s606, s607 and s609 of the flowchart of FIG. 23.

2. Example of Mounting on a Device

Figure 13:
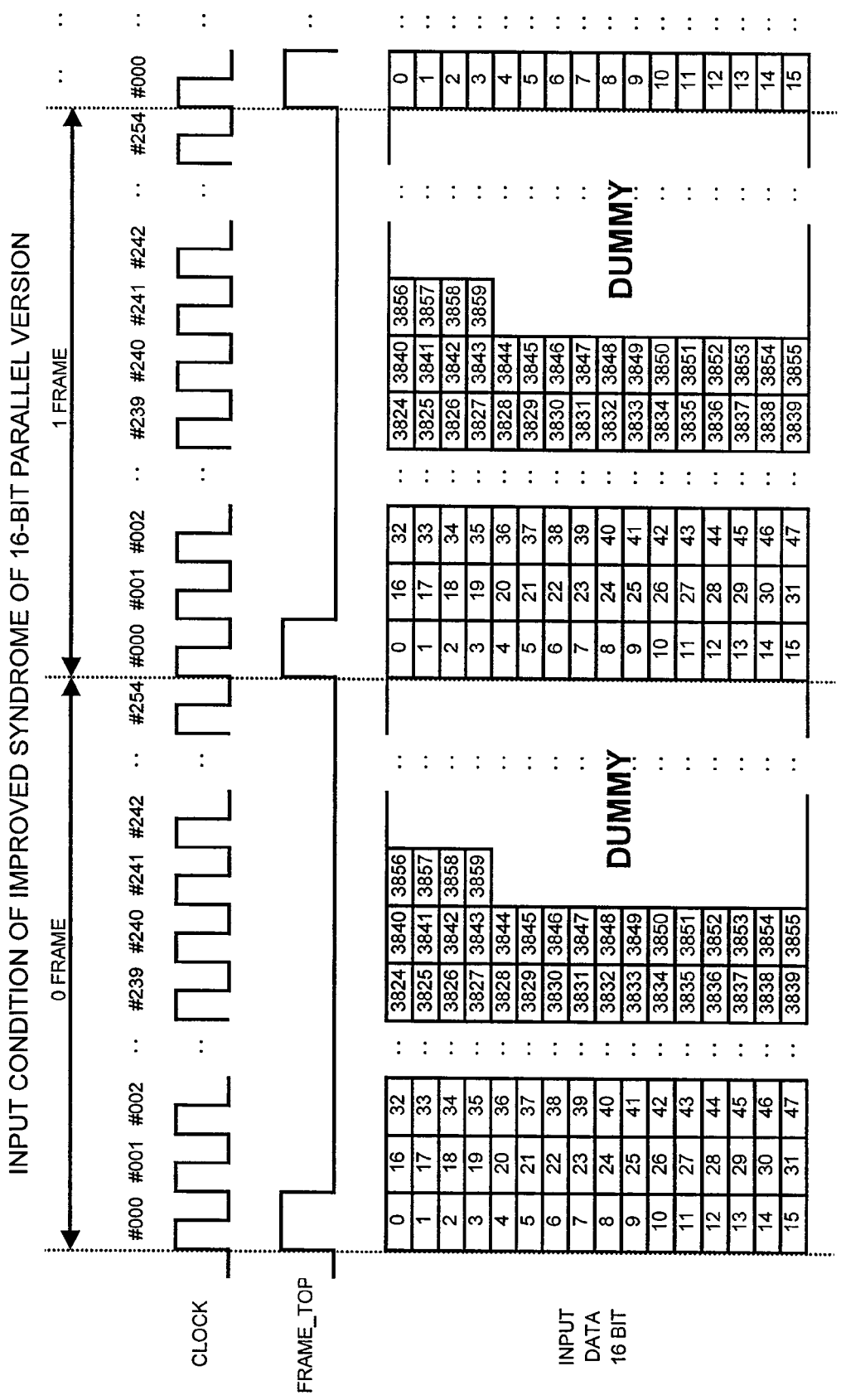
FIG. 13 is an explanatory view of an input condition of an improved syndrome of 16-bit parallel version.

Consideration will be given to a case where the algorithm described above is actually mounted on a device. As an example, a syndrome arithmetic circuit of BCH(3860, 3824) code will be described. In this case, when all of input and output are made to have 1 bit, it is necessary that an operation frequency is made considerably high for the process. Then, in this example, as shown in FIG. 13, the input and output is made to have 16 bits, and a description will be made. Although a number of bits of the input and output in parallel can be suitably determined, in this case, the number η of bits per 1 segment is 16, and when setting is performed as stated above, 1 clock corresponds to 1 segment. Thus, it is considered to be natural that the input and output is set at 16 bits parallel.

Figure 14:
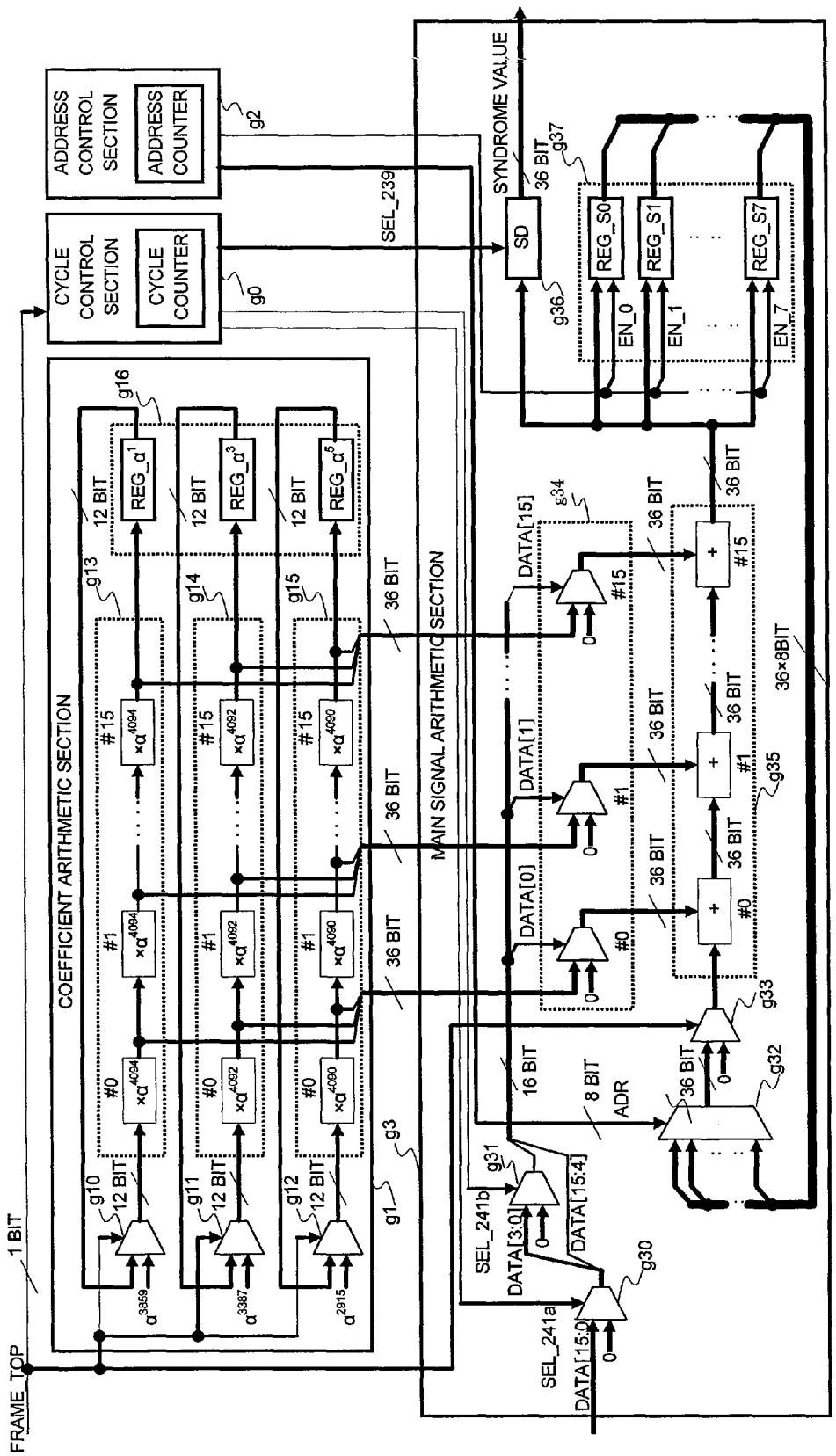
FIG. 14 is a structural view of an improved 16-bit parallel version syndrome arithmetic circuit of BCH(3860, 3824).
Figure 24:
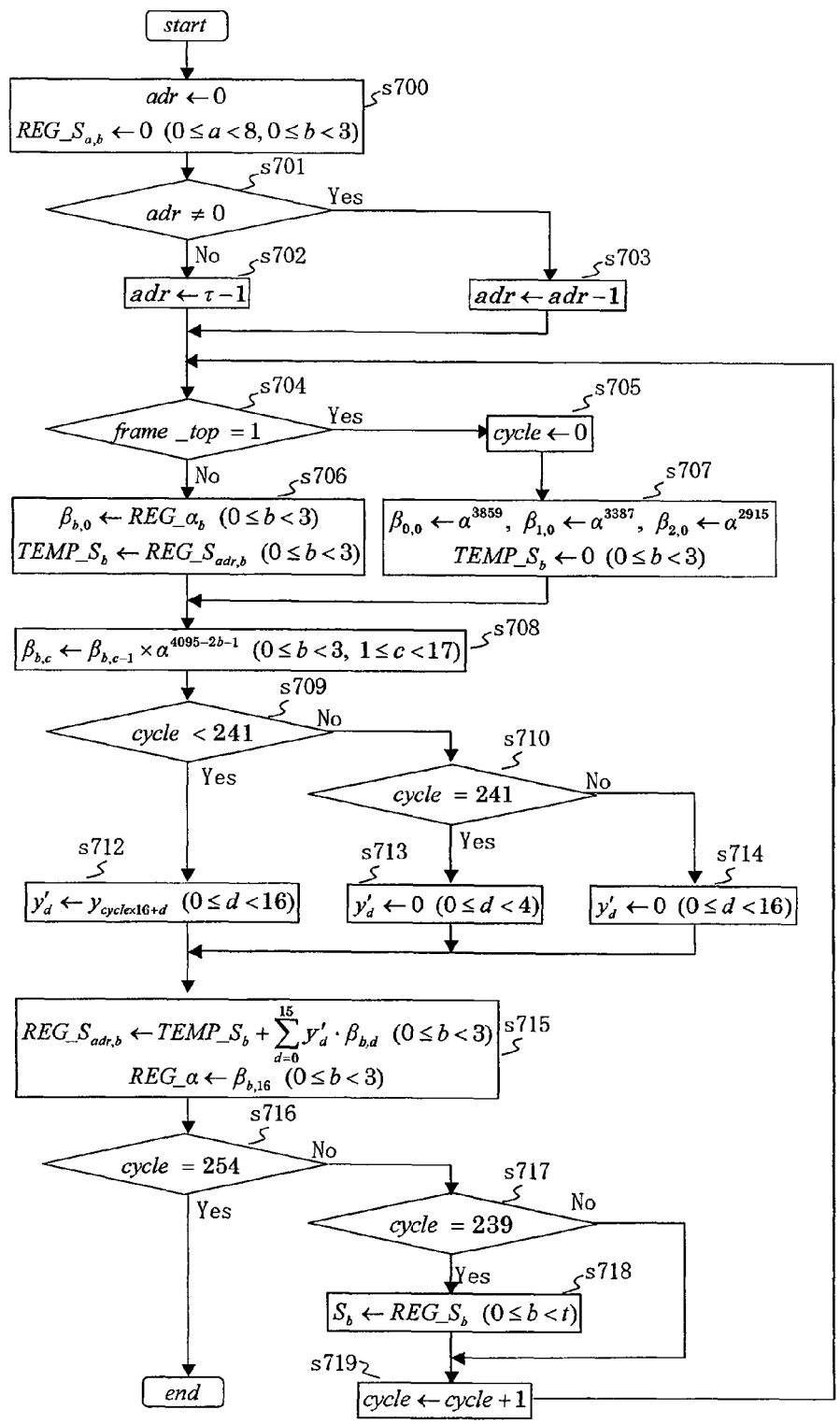
FIG. 24 is a flowchart of an improved 16-bit parallel version syndrome arithmetic operation of BCH(3860, 3824).

FIG. 24 shows a flowchart of the specific example, and FIG. 14 is a circuit structural view. Hereinafter, the description will be made while the flowchart is supplemented with the circuit structural view. Incidentally, in this method, it is supposed that the top of a frame appears once per 255 cycles.

Figure 15:
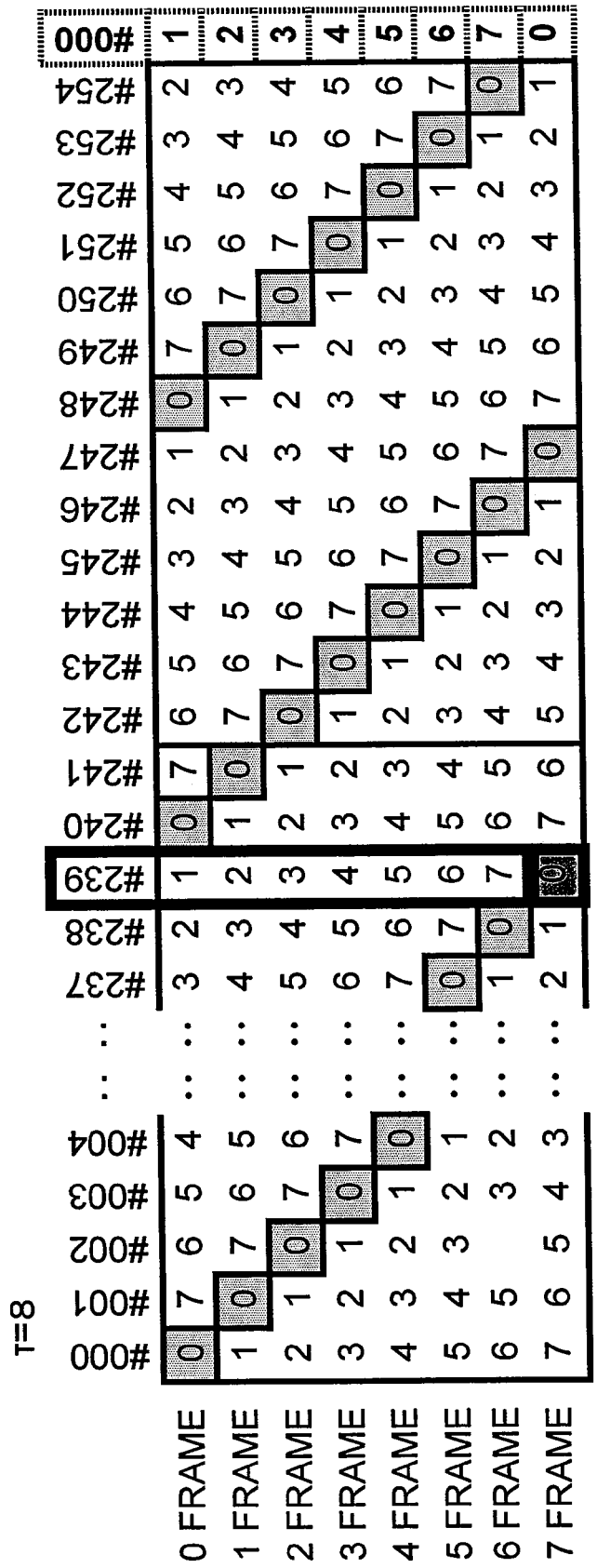
FIG. 15 is an explanatory view of address control of a 16-bit parallel version circuit.

First, address control at s701 in the flowchart is performed before determination of the top of a frame at s704. This means that differently from the past, the address control does not depend on the presence or absence of the top of a frame. The reason is as follows. When the circuit is operated for 255 cycles including a dummy signal as in FIG. 15, the address at the 0th segment is changed equally to the address control for each frame. Thus, even if the address control at s701, s702 and s703 is performed before s704 of determining the top of a frame, there is no problem. In the circuit, these controls are performed in an address control section g2.

At s704, the top of a frame is determined, and when the top of the frame appears, the cycle value is made 0 at s705. At this time, initial values are selected at s707. In this case, the values are $\alpha^{3859}$, $\alpha^{3387}$ and $\alpha^{2915}$, and these values are calculated from $(\alpha^i)^{3859} = \alpha^{MOD(i \times 3859, 4095)}$ (i=1, 3, 5). In the circuit, the initialization of the cycle value is performed by a cycle counter in a cycle control section g0, and the substitution of the initial values $\alpha^{3859}$, $\alpha^{3387}$ and $\alpha^{2915}$ is performed by selectors g10, g11 and g12 of a coefficient arithmetic section g1. Besides, at s707, the initialization of an input value for a syndrome arithmetic operation at s715 is also performed at s707. In the circuit, the operation of a selector g33 in a main signal arithmetic section g3 corresponds to the initialization.

In the case where the top of the frame does not appear, the process of s706 is performed, and the value calculated in the former segment is used for the arithmetic operation. In the circuit, the value of a register g16 in the coefficient arithmetic section g1 is used for the calculation of the coefficient value, and a value selected by a selector g32 in a register group g37 in the main signal arithmetic section g3 is used for the arithmetic operation.

The process of s708 indicates that three kinds of Galois field multipliers are respectively performed 16 times. In the circuit, these operations are performed by Galois field multipliers g13, g14 and g15 in the coefficient arithmetic section g1. The values of multiplication here become $\alpha^{-1}=\alpha^{4094}$, $\alpha^{-3}=\alpha^{4092}$ and $\alpha^{-5}=\alpha^{4090}$ from $\alpha^{-i}=\alpha^{4095-i}$.

As shown in FIG. 3, data is divided into three types, that is, information, check code and dummy, and when a syndrome value is calculated, it is necessary to apply different arithmetic methods to those. Besides, as shown in FIG. 13, at the 241th segment, a check code portion and a dummy portion are mixed in the 16-bit data. Steps s709 to s714 are for processing these. In the circuit, these processes are performed by selectors g30 and g31 in the main signal arithmetic section g3 and the control of control signals se1_214a and se1_214b outputted from the cycle control section g0.

At s715, Galois field arithmetic operation of expression (2) and storage of its result into a register indicated by the address control are performed. In the circuit, the arithmetic operation of expression (2) is performed by 16 processes in a selector group g34 and a Galois field adder group g35 in the main signal arithmetic section g3. The arithmetic operation result is stored in a register in a register group g37 where control signals en_0 to en_7 outputted from the address control section g2 are enabled. In this method, the result of the 16th Galois field multiplication is used for the coefficient arithmetic operation for the next segment. Thus, at s715, a process of holding the result of the 16th Galois field multiplication is also performed. In the circuit, the register group g16 in the coefficient arithmetic section g1 stores the result of the 16th Galois field multiplication.

In this specific example, from expressions (5) to (7), because of S_DEC=240, the syndrome value is decided at the 239th segment as indicated by s717. In the circuit, when the control signal se1_239 outputted from the cycle control section g0 is enabled, the arithmetic operation result is inputted to the register g36.

Figure 16:
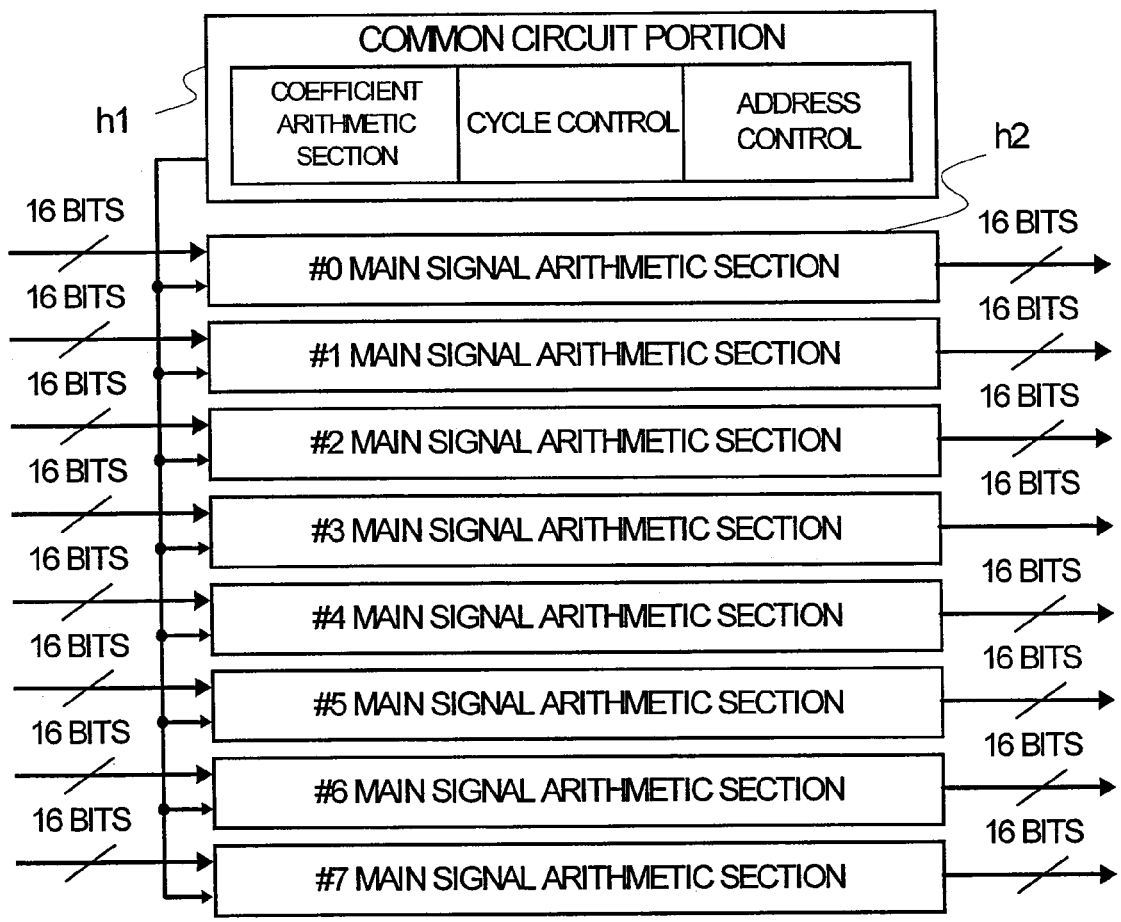
FIG. 16 is an explanatory view of an addition method of an improved syndrome arithmetic circuit.

When the syndrome arithmetic circuit shown in FIG. 14 is mounted on the outer decoding, as shown in FIG. 16, a structure is adopted in which a cycle control section, an address control section, and a coefficient arithmetic section, which are common portions, are shared, and only a main signal arithmetic section is added. The same addition method is adopted also for an error correction circuit, a check code calculation circuit, and a check code adding circuit.

The improved outer coding/decoding circuits are constructed in this way, and those are used to construct the concatenated codes. FIG. 17 shows this structure. The improved concatenated codes include an inner coding circuit i12, an inner decoding circuit i22, an outer coding circuit i11, and an outer decoding circuit i21. With respect to the inner coding circuit i12 and the inner decoding circuit i22, the equivalents in the concatenated codes of the related art can be used.

The outer coding circuit i11 is constructed such that a check code calculation circuit i111 and a check code adding circuit i113 are connected to each other through a delay buffer i112. The check code calculation circuit i111 and the check code adding circuit i113 are made to perform the process for 8 BCH(3860, 3824) codes by using the addition method shown in FIG. 16. The delay buffer i112 store data for τ frames (8 frames=261,120 bits at this time) until the calculation of the check code is ended in the check code calculation circuit i111.

The outer decoding circuit i21 is constructed such that an error position arithmetic circuit i213 and an error correction circuit i211 are connected to each other through a delay buffer i212. In the error position arithmetic circuit i213, this improvement is applied to a syndrome arithmetic circuit, and a chien search circuit is not changed. However, it is necessary that only the error locator polynomial arithmetic circuit is changed so that a syndrome coefficient with an odd suffix is calculated from a syndrome coefficient with an even suffix. The improved syndrome arithmetic circuit and the error correction circuit i211 are made to perform the process for 8 BCH(3860, 3824) codes by using the addition method shown in FIG. 16. The delay buffer i212 also stores data for τ frames similarly to the delay buffer i112. This is because it takes a time for τ frames to calculate the syndrome value in the improved syndrome arithmetic circuit.

The circuit structure of FIG. 17 and the memory amount of the concatenated codes of the past will be described. When the memory amount is compared, the result is as shown in Table 3. Here, a loop represents how many times a pair of an inner decoding circuit and an outer decoding circuit is repeated, and the example of G.975.1 I3 has 3 loops. The Table does not include a memory used for a delay buffer for waiting time of an error locator polynomial arithmetic circuit and a chien search arithmetic circuit (since a mounting method varies according to a person). However, since there is no difference in delay for syndrome arithmetic operation according to specifications, it is included in this Table. The syndrome arithmetic circuit exists in both the inner decoding circuit and the outer decoding circuit, and a delay for 1 frame (=32,640 bits) is required, and therefore, it has 32,640×(2× the number of loops) bits.

TABLE 3

| | 1 loop | 2 loops | 3 loops | 4 loops |
|---|---|---|---|---|
| G.975.1 I3 | 261,120 × 2 + 32,640 × 2 ≈ 0.6 Mbits | 261,120 × 4 + 32,640 × 4 ≈ 1.1 Mbits | 261,120 × 6 + 32,640 × 6 ≈ 1.7 Mbits | 261,120 × 8 + 32,640 × 8 ≈ 2.2 Mbits |
| G.975.1 I3 + debug function | 261,120 × 4 + 32,640 × 2 ≈ 1.1 Mbits | 261,120 × 6 + 32,640 × 4 ≈ 1.6 Mbits | 261,120 × 8 + 32,640 × 6 ≈ 2.2 Mbits | 261,120 × 10 + 32,640 × 8 ≈ 2.7 Mbits |
| improved circuit | 261,120 × 2 + 32,640 × 1 ≈ 0.5 Mbits | 261,120 × 3 + 32,640 × 2 ≈ 0.8 Mbits | 261,120 × 4 + 32,640 × 3 ≈ 1.1 Mbits | 261,120 × 5 + 32,640 × 4 ≈ 1.4 Mbits |

As is understood from Table 3, according to this embodiment, the memory amount is greatly reduced. By this, heat generation due to power consumption of the ON-CHIP memory and the memory diagnosis circuit are also reduced.

It is conceivable that a circuit area is increased by influence of two points of (1) the Galois field arithmetic method is different from a normal one, and (2) the number of registers in the improved circuit is increased as shown in FIG. 5. However, with respect to (1), it is conceivable that when the addition method shown in FIG. 16 is performed, there is no much change. With respect to (2), although the number is certainly increased, the memory and the memory diagnosis circuit are greatly reduced, and therefore, the circuit area can be reduced in total.

Although the embodiment is described while G.975.1 I3 is used as the specific example, the embodiment can be applied to other concatenated codes by using the flowcharts of FIG. 19 to FIG. 23. In this example, although the outer coding/decoding circuit is improved, this is because the check code length of the outer code is shorter than that of the inner code. Accordingly, this embodiment may be applied to the inner circuit. As shown in FIG. 5, the number of registers in the improved circuit is c times larger than that of the circuit of the related art. Since the number of bits of the register is the same as the check code length, it is more advantageous that this embodiment is applied to a code in which the check code length is short.

The concatenated codes are used for computers, audio/video and the like in addition to the field of communication. In the method of the related art, in order to obtain a high coding gain by the concatenated codes, the memory must be increased, and the capacity is very large when it is treated as an ON-CHIP. The invention greatly reduces the memory of the concatenated codes. Thus, it is believed that the invention greatly contributes to the improvement of the coding/decoding technique.

Besides, the invention can be applied to a digital signal processing technique to perform coding/decoding. Besides, the invention can be applied to, for example, a coding/decoding circuit for error correction in optical communication.

What is claimed is:

1. An arithmetic circuit of concatenated codes used for a coding circuit or a decoding circuit, comprising:
    an arithmetic section to perform an arithmetic operation for coding or decoding;
    a first to a $\tau$th ($\tau$ is an integer of 2 or more) registers; and
    an address control section to specify an address of a register to which an arithmetic operation result of the arithmetic section is written among the first to the $\tau$th registers,
    wherein the address control section performs
    an address control for each frame, in which a first address is changed to switch a writing destination of the arithmetic operation result for a top segment of a frame sequentially and circularly to the first to the $\tau$th registers for respective frames, and
    an address control for each segment, in which a second address is changed to switch a writing destination of the arithmetic operation result for each segment in the frame sequentially and circularly from the register indicated by the first address for the top segment of the frame, in a direction from the $\tau$th register to the first register for respective segments,
    wherein the arithmetic operation result of the arithmetic section is written in the first to the $\tau$th registers for the respective segments in accordance with the second address.

2. The arithmetic circuit according to claim 1, wherein in the address control for each frame, the address control section circularly changes the first address in order of from the first register to the $\tau$th register and to the first register after the $\tau$th register, and
    in the address control for each segment, the address control section circularly changes the second address in order of from the register indicated by the first address to the first register, and to the $\tau$th register after the first register, and in order of from the $\tau$th register to the first register.

3. The arithmetic circuit according to claim 1, wherein the arithmetic circuit is a syndrome arithmetic circuit in the decoding circuit,
    the arithmetic section performs an arithmetic operation on inputted data to obtain a coefficient value of a syndrome polynomial,
    after the arithmetic operation of the arithmetic section for the segment in which the coefficient value of a predetermined syndrome polynomial is decided, and writing the arithmetic operation result to the register indicated by the second address specified by the address control section, a value stored in the register is outputted as the coefficient value of the syndrome polynomial.

4. The arithmetic circuit according to claim 3, wherein the arithmetic section reads data from the register indicated by the second address, performs an arithmetic operation of the following expression based on read data TEMP_$S_b$, inputted data y, and a coefficient $\alpha$, and writes the arithmetic operation result into the register indicated by the second address:

$$\text{arithmetic operation result} = \text{TEMP\_}S_b + y_{n-1\text{-}cycle} \cdot (\alpha^{2b+1})^{n-1\text{-}cycle} \, (0 \leq b < t)$$

where, n: the number of bits in a concatenated code including information bits and check code bits, $y_j$: 1-bit input data ($0 \leq j < n$), cycle: cycle number, b: identification information of a coefficient of the syndrome polynomial, and t: the number of correctable maximum bits.

5. The arithmetic circuit according to claim 3, further comprising
    a coefficient arithmetic section that obtains a coefficient $\alpha$ for obtaining a syndrome coefficient value by performing Galois field multiplication to reduce an index of the coefficient from a predetermined initial value of the coefficient $\alpha$.

6. The arithmetic circuit according to claim 3, wherein when the number of bits in a concatenated code including information bits and check code bits is n, the number of bits per 1 segment is $\eta$ and a quotient obtained by dividing n by $\eta$ is $\xi_s$,
    when n is dividable by $\eta$, the segment in which the coefficient value of the syndrome polynomial is decided is obtained by the following expression:

$$\text{position of the segment} = \xi_s - \text{MOD}(\xi_s, \tau),$$

when n is not dividable by $\eta$, the segment is obtained by the following expression:

$$\text{position of the segment} = \xi_s + 1) - \text{MOD}(\xi_s + 1), \tau),$$

where $\text{MOD}(\xi_s, \tau)$ and $\text{MOD}((\xi_s + 1), \tau)$ are remainders obtained by dividing $\xi_s$ and ($\xi_s + 1$) by $\tau$, respectively.

7. The arithmetic circuit according to claim 3, wherein the outputted coefficient value of the syndrome polynomial corresponds to a coefficient value of the syndrome polynomial for a new frame which is obtained by rearranging an inputted frame by interleaving or deinterleaving.

8. The arithmetic circuit according to claim 1, wherein the arithmetic circuit is an error correction circuit in the decoding circuit, and
    the arithmetic section inputs an error position and performs an error correction processing.

9. The arithmetic circuit according to claim 1, wherein the arithmetic circuit is a check code calculation circuit in the coding circuit, the arithmetic section performs an arithmetic operation on inputted data to obtain a coefficient of a check code polynomial, after the arithmetic operation of the arithmetic section performs for the segment in which the coefficient value of a predetermined check code polynomial is decided, and writing the arithmetic operation result to the register indicated by the second address specified by the address control section, a value stored in the register is outputted as the coefficient value of the check code polynomial.

10. The arithmetic circuit according to claim 9, wherein the arithmetic section reads data from the register indicated by the second address, performs an arithmetic operation of the following expression based on read data $TEMP\_P_b$, inputted data i, and a coefficient $\gamma$, and writes the arithmetic operation result into the register indicated by the second address:

$$\text{arithmetic operation result} = TEMP\_P_b + i_{k-1-cycle} \gamma_{n-1-cycle,b} \ (0 \leq b < m),$$

where n: the number of bits in a concatenated code including information bits and check code bits, k: the number of the information bits, $i_j$: 1-bit input data ($0 \leq j < k$), cycle: cycle number, b: identification information of a coefficient of the check code polynomial, and m: the number of the check code bits.

11. The arithmetic circuit according to claim 9, wherein the arithmetic section further comprising a coefficient arithmetic section to obtain a coefficient $\gamma$ for obtaining a check code by using a shift register which reversely shifts or in a direction from a higher degree to a lower degree based on a predetermined general polynomial.

12. The arithmetic circuit according to claim 9, wherein when the number of information bits in a concatenated code including check code bits and the information bits is k, the number of bits per 1 segment is $\eta$, and a quotient obtained by dividing k by $\eta$ is $\xi_p$, when k is dividable by $\eta$, the segment in which the coefficient value of the check code polynomial is decided is obtained by the following expression:

$$\text{position of the segment} = \xi_p - MOD(\xi_p, \tau),$$

when k is not dividable by $\eta$, the segment is obtained by the following expression:

$$\text{position of the segment} = (\xi_p + 1) - MOD((\xi_p + 1), \tau)$$

where $MOD(\xi_p, \tau)$ and $MOD((\xi_p + 1), \tau)$ are remainders obtained by dividing $\xi_p$ and $(\xi_p + 1)$ by $\tau$, respectively.

13. The arithmetic circuit according to claim 9, wherein the outputted coefficient value of the check code polynomial corresponds to a coefficient value of the check code polynomial for a new frame which is obtained by rearranging an inputted frame by interleaving or deinterleaving.

14. The arithmetic circuit according to claim 1, wherein the arithmetic circuit is a check code calculation circuit in the coding circuit, and the arithmetic section adds an inputted value of a check code to a signal.

15. The arithmetic circuit according to claim 1, wherein the arithmetic circuit inputs a plurality of bits in parallel, and the number of bits inputted in parallel corresponds to the number of bits per segment.

16. An address control method for registers in an arithmetic circuit of concatenated codes used for a coding circuit or a decoding circuit, comprising the steps of:

performing an arithmetic operation for coding or decoding;

performing, by the coding circuit or the decoding circuit, an address control for each frame, in which a first address is changed to switch a writing destination of a result of the arithmetic operation for a top segment of a frame sequentially and circularly to a first to a $\tau$th registers for respective frames; and performing an address control for each segment, in which a second address is changed to switch a writing destination of the arithmetic operation result for each segment in the frame sequentially and circularly from the register indicated by the first address for the top segment of the frame, in a direction from the $\tau$th register to the first register for respective segments, wherein the arithmetic operation result is written in the first to the $\tau$th registers for the respective segments in accordance with the second address.

* * * * *